US009509342B2

(12) United States Patent
Vernon

(10) Patent No.: US 9,509,342 B2
(45) Date of Patent: Nov. 29, 2016

(54) ERROR CORRECTING CODE DECODER

(71) Applicant: Fusion-io, Inc., Salt Lake City, UT (US)

(72) Inventor: Mark Vernon, Park City, UT (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 168 days.

(21) Appl. No.: 14/332,178

(22) Filed: Jul. 15, 2014

(65) Prior Publication Data

US 2015/0349807 A1    Dec. 3, 2015

Related U.S. Application Data

(60) Provisional application No. 62/006,637, filed on Jun. 2, 2014.

(51) Int. Cl.
  *H03M 13/00* (2006.01)
  *H03M 13/35* (2006.01)
  *H03M 13/11* (2006.01)

(52) U.S. Cl.
  CPC ....... *H03M 13/353* (2013.01); *H03M 13/1102* (2013.01)

(58) Field of Classification Search
  CPC ........... H03M 13/1102; H03M 13/353; G06F 11/1068; G06F 11/1044; G11C 11/5621; G11C 11/5692; G11C 29/00
  See application file for complete search history.

(56) References Cited

U.S. PATENT DOCUMENTS

| 8,266,493 B1 | 9/2012 | Abbaszadeh et al. |
| 8,352,827 B2 | 1/2013 | Gong et al. |
| 8,543,883 B2 | 9/2013 | Chen et al. |
| 8,555,131 B2 | 10/2013 | Rault et al. |
| 8,645,802 B2 | 2/2014 | Obata et al. |
| 8,739,004 B2 | 5/2014 | Olcay et al. |
| 2010/0199149 A1* | 8/2010 | Weingarten ......... G06F 11/1068 714/773 |
| 2012/0239868 A1 | 9/2012 | Ryan et al. |
| 2015/0171937 A1* | 6/2015 | Murakami ............... H04B 7/04 375/267 |

OTHER PUBLICATIONS

Ta, Tuan, "A Tutorial on Low Density Parity-Check Codes", The University of Texas at Austin, downloaded as early as Aug. 2, 2013, pp. 15.
Nguyen, Dung Viet, "Two-Bit Bit Flipping Decoding of LDPC Codes", University of Arizona, Mar. 3, 2011, pp. 6.

* cited by examiner

*Primary Examiner* — Guerrier Merant
(74) *Attorney, Agent, or Firm* — Kunzler Law Group, PC

(57) ABSTRACT

Apparatuses, systems, methods, and computer program products are disclosed for error correcting code (ECC) decoding. A soft information module may be configured to determine whether to obtain an indication of the accuracy of a data value for a variable node of an ECC decoder such as a low density parity check (LDPC) code decoder. A score module may be configured to assign and update a score for the variable node. The score may be based on the accuracy indication and on a count of unsatisfied check nodes of the ECC decoder that are associated with the variable node. A precision for the score may be based on an estimated number of errors for the received code word. A check node update module may be configured to update check nodes associated with the variable node based on the score.

19 Claims, 7 Drawing Sheets

ERROR CORRECTING CODE DECODER

CROSS-REFERENCES TO RELATED APPLICATIONS

This application claims the benefit of U.S. Provisional Patent Application No. 62/006,637 entitled "ERROR CORRECTING CODE DECODER" and filed on Jun. 2, 2014, for Mark Vernon, which is incorporated herein by reference.

TECHNICAL FIELD

The present disclosure, in various embodiments, relates to error correcting codes and more particularly relates to soft-decision decoders for low density parity check codes.

BACKGROUND

Error correcting codes encode data redundantly to compensate for data errors in noisy communication channels. As data storage densities and transmission rates increase, the effects of error-causing disturbances may become more pronounced, leading to increased error rates. Low density parity check (LDPC) codes offer error correction performance close to a theoretical maximum.

Soft-decision LDPC code decoders achieve high error correction performance by operating on "soft," or probabilistic data, unlike hard-decision LDPC code decoders, which operate on "hard," non-probabilistic data. For example, to correct errors in binary data, a hard-decision decoder may receive only the binary data values, but a soft-decision decoder may receive the binary data values plus additional information indicating the reliability of each binary value (e.g., estimated likelihoods that the data values are correct). However, although a soft-decision decoder may offer higher error correction performance than a hard-decision decoder, the soft-decision decoder may be significantly more computationally complex than the hard-decision decoder, and may also be slower.

SUMMARY

Methods are presented for error correcting code (ECC) decoding. In one embodiment, a method includes determining, based on an estimated number of errors for a code word received by an ECC decoder, whether to obtain indications of accuracy for data values of the received code word. In a further embodiment, the method includes correcting one or more errors in the received code word based on the accuracy indications using the ECC decoder, in response to determining to obtain the accuracy indications. In a certain embodiment, the method includes one or more errors in the received code word using the ECC decoder in response to determining not to obtain the accuracy indications.

Apparatuses are presented for ECC decoding. In one embodiment, a soft information module of a low density parity check (LDPC) code decoder is configured to determine soft information for a plurality of variable nodes of the LDPC code decoder for a received code word. In a further embodiment, a score module of the LDPC code decoder is configured to iteratively calculate scores for the variable nodes. A score module, in certain embodiments, is configured to determine initial scores for the variable nodes based on the soft information. In some embodiments, a check node update module of the LDPC code decoder is configured to iteratively revise one or more check nodes based on the scores.

An apparatus, in another embodiment, includes means for reading an indication of accuracy for a data value of a code word received by a low density parity check (LDPC) code decoder. In a further embodiment, the data value may correspond to a message node of the LDPC code decoder. In a certain embodiment, the apparatus includes means for determining a precision for a score for the message node based on the estimated number of errors and/or a desired level of error-correction capability. In a certain embodiment, a value for the score may be based on the accuracy indication. In a further embodiment, the apparatus includes means for updating check nodes associated with the message node based on the score.

Computer program products comprising a computer readable storage medium are presented. In certain embodiments, a computer readable storage medium stores computer usable program code executable to perform operations for ECC decoding. In one embodiment, the operations include determining, based on an estimated number of errors for a code word received by a low density parity check (LDPC) code decoder, whether to obtain soft data for data values corresponding to subcode nodes of the LDPC code decoder. In a certain embodiment, the soft data may indicate likelihoods that the data values are correct. In a further embodiment, the operations include reading the soft data in response to determining to obtain the soft data. In some embodiments, the operations include associating a score with the subcode node based on the soft data. In further embodiments, the score may further be based on a count of unsatisfied check nodes of the LDPC code decoder that are associated with the subcode node. In certain embodiments, a check node is unsatisfied in response to values of subcode nodes associated with the check node adding to an odd number. In some embodiments, a precision for the score may be selected based on the estimated number of errors. In one embodiment, the operations include positioning a score threshold within a range of possible values for the score. In a certain embodiment, the score threshold may divide the range of possible values into a first range and a second range. In a further embodiment, the first range may be larger than the second range. In some embodiments, the size of the first range may correspond to a distance between possible initial scores that indicate different estimated probabilities that a bit is in error. In some embodiments, the operations include updating check nodes associated with the subcode node based on the score.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
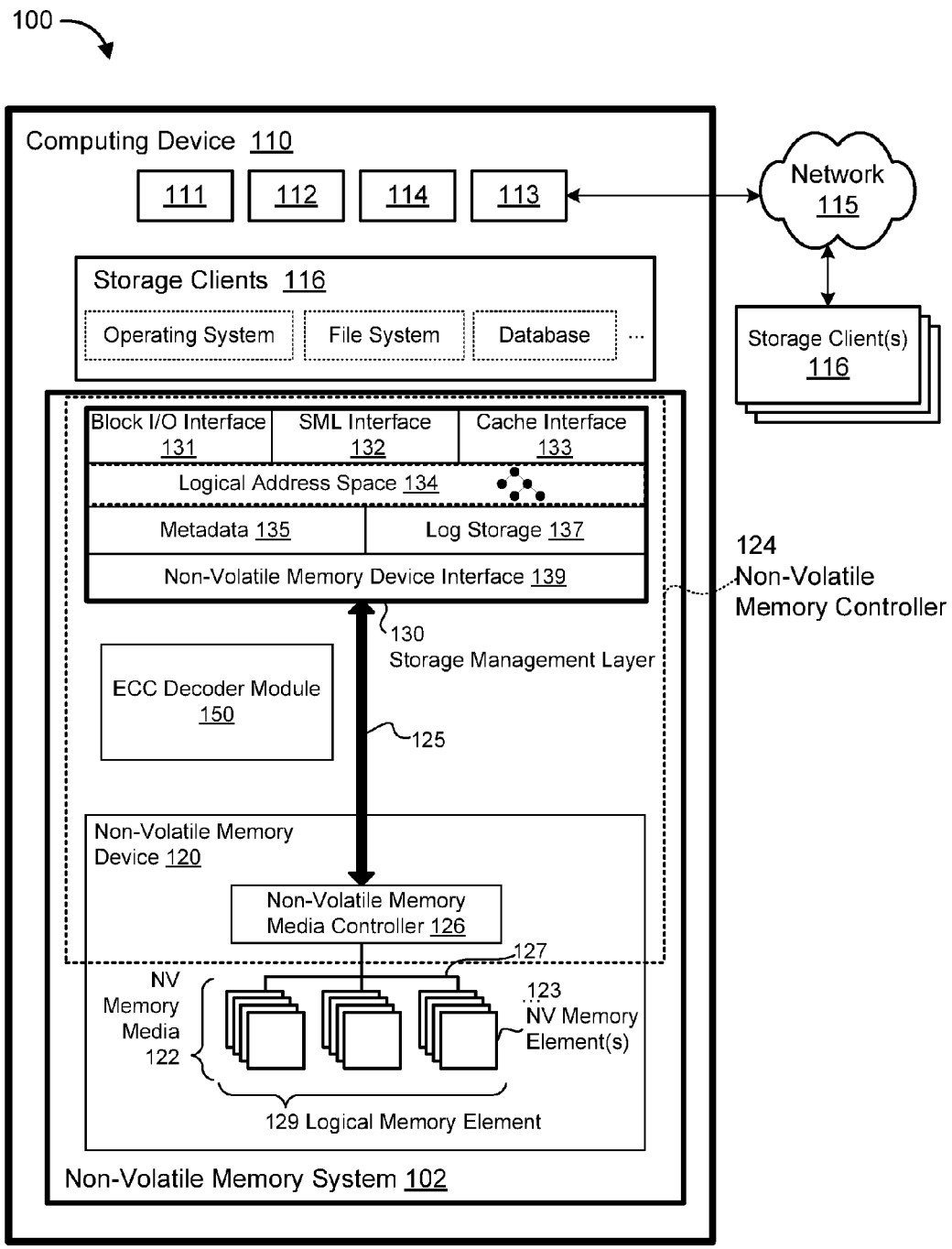
FIG. 1 is a schematic block diagram illustrating one embodiment of a system comprising an error correcting code (ECC) decoder module.

Aspects of the present disclosure may be embodied as an apparatus, system, method, or computer program product. Accordingly, aspects of the present disclosure may take the form of an entirely hardware embodiment, an embodiment comprising software (including firmware, resident software, micro-code, or the like) embodied in one or more non-transitory computer readable storage media storing computer readable and/or executable program code, or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium that may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising an error correcting code (ECC) decoder module 150. The ECC decoder module 150 may be part of and/or in communication with one or more of a non-volatile memory controller 124, a non-volatile memory media controller 126, a device driver or storage management layer (SML) 130, or the like. The ECC decoder module 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the ECC decoder module 150 may be embodied as one or more computer readable instructions stored on the non-transitory storage media 114.

The non-volatile memory system 102, in the depicted embodiment, includes an ECC decoder module 150. An ECC decoder, as used herein, comprises a hardware and/or software module, configured to use redundancy information defined for a data set (e.g., a code word) to detect and/or correct one or more errors in the data set. The ECC decoder module 150, in one embodiment, is configured to selectively receive soft information for a variable node of a low density parity check (LDPC) code decoder. In other embodiments, the ECC decoder module 150 may comprise another type of decoder, such as a Reed-Solomon code decoder, a Golay code decoder, a Bose Chaudhuri Hocquenghem (BCH) code decoder, a turbo code decoder, a multidimensional parity code decoder, a Hamming code decoder, a Hadamard code decoder, an expander code decoder, a Reed-Muller code decoder, a Viterbi decoder, a Fano decoder, or the like. An LDPC code decoder, as used herein, comprises a linear ECC decoder using a parity check matrix or other data structure to detect and/or correct one or more errors. In certain embodiments, an LDPC code decoder may be constructed or represented as a sparse bipartite graph, with variable nodes and check nodes as described below. A code word, as used herein, comprises a data set or amount of data upon which an ECC encoder and/or an ECC decoder operates to correct data. A code word may have a fixed size (e.g., for block codes or concatenated convolutional codes), a constraint length (e.g., for convolutional codes), or the like.

Soft information or soft data, as used herein, comprises an indication of a reliability, accuracy, and/or quality of a data value determined for a storage cell. For example, the soft information, in some embodiments, may indicate an accuracy for a corresponding bit of a received code word. In a certain embodiment, the ECC decoder module 150 is configured to assign a score to the variable node. In a further embodiment, the score may be based on the soft information and on a count of unsatisfied check nodes of the LDPC code decoder that are associated with the variable node. In one embodiment the ECC decoder module 150 is configured to update, revise, toggle, or flip check nodes (e.g., a data bit) associated with the variable node in response to the score crossing a score threshold. Assigning a score to a variable node based on soft information and unsatisfied check nodes generates updated information about the likelihood that a corresponding bit in the received code word is correct, similar to the initially-received soft information, while avoiding delays and higher computational complexity associated with explicitly propagating the soft information through the LDPC code decoder (e.g., by explicitly passing messages among nodes). Thus, by assigning scores to variable nodes based on soft information and unsatisfied check nodes, the ECC decoder module 150 may provide a soft-decision decoder with high error correction performance, while avoiding large increases in computational complexity or decreases in speed, as compared to a hard-decision decoder.

In one embodiment, the ECC decoder module 150 may comprise executable software code, such as a device driver, SML 130, or the like, stored on the computer readable storage media 114 for execution on the processor 111. In another embodiment the ECC decoder module 150 may comprise logic hardware of one or more non-volatile memory devices 120, such as a non-volatile memory media controller 126, a non-volatile memory controller 124, a device controller, a field-programmable gate array (FPGA) or other programmable logic, firmware for an FPGA or other programmable logic, microcode for execution on a microcontroller, an application-specific integrated circuit (ASIC), or the like. In a further embodiment, the ECC decoder module 150 may include a combination of both executable software code and logic hardware.

In one embodiment, the ECC decoder module 150 is configured to decode data in response to receiving storage requests from the SML 130 via a bus 125 or the like. The ECC decoder module 150 may be further configured to transfer data to/from the SML 130 and/or storage clients 116 via the bus 125. Accordingly, the ECC decoder module 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the ECC decoder module 150 may receive storage requests as an API call from a storage client 116, as an IO-CTL command, or the like. The ECC decoder module 150 is described in greater detail below with regard to FIGS. 3 and 4.

According to various embodiments, a non-volatile memory controller 124 comprising the ECC decoder module 150 may manage one or more non-volatile memory devices 120. The non-volatile memory device(s) 120 may comprise recording, memory, and/or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, erase blocks, sectors, blocks, collections or sets of physical storage locations (e.g., logical pages, logical erase blocks, described below), or the like.

The non-volatile memory controller 124 may comprise an SML 130, which may present a logical address space 134 to one or more storage clients 116. One example of an SML is the Virtual Storage Layer® of Fusion-io, Inc. of Salt Lake City, Utah. Alternatively, each non-volatile memory device 120 may comprise a non-volatile memory media controller 126, which may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The SML 130 may maintain metadata 135, such as a forward index, to map logical addresses of the logical address space 134 to media storage locations on the non-volatile memory device(s) 120. The SML 130 may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML 130 may map logical addresses to physical data resources of any size and/or granularity, which may or may not correspond to the underlying data partitioning scheme of the non-volatile memory device(s) 120. For example, in some embodiments, the non-volatile memory controller 124 is configured to store data within logical memory units that are formed by logically combining a plurality of physical memory units, which may allow the non-volatile memory controller 124 to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (e.g., each non-volatile memory element being accessible in parallel). As used herein, a logical memory division refers to a set of two or more physical memory divisions, each physical memory division on a respective non-volatile memory element in the respective logical memory element.

The logical address space 134 presented by the SML 130 may have a logical capacity, which may correspond to the number of available logical addresses in the logical address space 134 and the size and/or granularity of the data referenced by the logical addresses. For example, the logical capacity of a logical address space 134 comprising $2^{12}$ unique logical addresses, each referencing 2048 bytes (2 KiB) of data may be $2^{43}$ bytes. As used herein, a kibibyte (KiB) refers to 1024 bytes. In some embodiments, the logical address space 134 may be thinly provisioned. As used herein, a "thinly provisioned" logical address space 134 refers to a logical address space 134 having a logical capacity that exceeds the physical capacity of the underlying non-volatile memory device(s) 120. For example, the SML 130 may present a 64-bit logical address space 134 to the storage clients 116 (e.g., a logical address space 134 referenced by 64-bit logical addresses), which may exceed the physical capacity of the underlying non-volatile memory devices 120. The large logical address space 134 may allow storage clients 116 to allocate and/or reference contiguous ranges of logical addresses, while reducing the chance of naming conflicts. The SML 130 may leverage the any-to-any mappings between logical addresses and physical storage resources to manage the logical address space 134 independently of the underlying physical storage devices 120. For example, the SML 130 may add and/or remove physical storage resources seamlessly, as needed, and without changing the logical addresses used by the storage clients 116.

The non-volatile memory controller 124 may be configured to store data in a contextual format. As used herein, a contextual format refers to a self-describing data format in which persistent contextual metadata is stored with the data on the physical storage media 122. The persistent contextual metadata provides context for the data with which it is stored. In certain embodiments, the persistent contextual metadata uniquely identifies the data with which the persistent contextual metadata is stored. For example, the persistent contextual metadata may uniquely identify a sector or block of data owned by a storage client 116 from other sectors or blocks of data owned by the storage client 116. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In a certain embodiment, the persistent contextual metadata identifies at least one of a plurality of aspects, including data type, a unique data identifier, an operation, and a sequence of operations performed on the data.

The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile memory media 122, a memory division index, or the like).

In some embodiments, the contextual data format may allow data context to be determined and/or reconstructed based upon the contents of the non-volatile memory media 122, and independently of other metadata, such as the arbitrary, any-to-any mappings discussed above. Since the media location of data is independent of the logical address of the data, it may be inefficient or impossible to determine the context of data based solely upon the media location or media address of the data. Storing data in a contextual format on the non-volatile memory media 122 may allow data context to be determined without reference to other metadata. For example, the contextual data format may allow the metadata to be reconstructed based only upon the contents of the non-volatile memory media 122 (e.g., reconstruct the any-to-any mappings between logical addresses and media locations).

In some embodiments, the non-volatile memory controller 124 may be configured to store data on one or more asymmetric, write-once media 122, such as solid-state storage media. As used herein, a "write once" storage medium refers to a storage medium that is reinitialized (e.g., erased) each time new data is written or programmed thereon. As used herein, an "asymmetric" storage medium refers to a storage medium 122 having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media).

The memory media 122 may be partitioned into memory divisions that can be erased as a group (e.g., erase blocks) in order to, inter alia, account for the asymmetric properties of the media 122 or the like. As such, modifying a single data segment in-place may require erasing the entire erase block comprising the data, and rewriting the modified data to the erase block, along with the original, unchanged data. This may result in inefficient "write amplification," which may excessively wear the media 122. Therefore, in some embodiments, the non-volatile memory controller 124 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

The non-volatile memory controller 124 may comprise one or more processes that operate outside of the regular path for servicing of storage operations (e.g., the "path" for performing a storage operation and/or servicing a storage request). As used herein, the "path for servicing a storage request" or "path for servicing a storage operation" (also referred to as the "critical path") refers to a series of processing operations needed to service the storage operation or request, such as a read, write, modify, or the like. The path for servicing a storage request may comprise receiving the request from a storage client 116, identifying the logical addresses of the request, performing one or more storage operations on non-volatile memory media 122, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller 124 comprises a groomer, which is configured to reclaim memory divisions (e.g., logical or physical erase blocks) for reuse, using a garbage collection or other storage capacity recovery process. The write out-of-place paradigm implemented by the non-volatile memory controller 124 may result in obsolete or invalid data remaining on the non-volatile memory media 122. For example, overwriting data X with data Y may result in storing Y on a new memory division (e.g., rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media 122 may accumulate a significant amount of invalid data.

A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller 124 may be further configured to store data in a log format. As described above, a log format refers to a data format that defines an ordered sequence of storage operations performed on a non-volatile memory media 122. In some embodiments, the log format comprises storing data in a pre-determined sequence of media addresses of the non-volatile memory media 122 (e.g., within sequential pages and/or erase blocks of the media 122). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller 124, using the log storage module 137 described below or the like, may maintain a current append point at a media address of the non-volatile memory device 120. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller 124 may identify the "next" available memory division (e.g., the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media 122, and independently of other metadata. As discussed above, invalid data may not be removed from the non-volatile memory media 122 until the memory division comprising the data is reclaimed. Therefore, multiple "versions" of data having the same context may exist on the non-volatile memory media 122 (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

The storage management layer 130 may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

The storage management layer 130 comprises and/or is communicatively coupled to one or more non-volatile memory devices 120. The one or more non-volatile memory devices 120 may include different types of non-volatile memory devices including, but not limited to: solid-state storage devices, hard drives, SAN storage resources, or the like. The one or more non-volatile memory devices 120 may comprise one or more respective non-volatile memory media controllers 126 and non-volatile memory media 122. As illustrated in FIG. 1, The SML 130 may provide access to the one or more non-volatile memory devices 120 via a traditional block I/O interface 131. Additionally, the SML 130 may provide access to enhanced functionality (e.g., a large, virtual address space 134) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the one or more non-volatile memory devices 120 and/or the one or more non-volatile memory media controllers 126.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations the on one or more non-volatile memory devices 120. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122, which define an ordered sequence of storage operations performed on the one or more non-volatile memory devices 120, as described above.

The SML 130 may further comprise a non-volatile memory device interface 139 configured to transfer data, commands, and/or queries to the one or more non-volatile memory devices 120 over a bus 125, which may include, but is not limited to: a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 124 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 124 comprises one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), resistive RAM (RRAM), programmable metallization cell (PMC), conductive-bridging RAM (CBRAM), magneto-resistive RAM (MRAM), dynamic RAM (DRAM), phase change RAM (PRAM or PCM), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on and/or read data from the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (e.g., a page of each element of non-volatile memory media 122).

The non-volatile memory controller 124 may comprise an SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (e.g., through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

Figure 2:
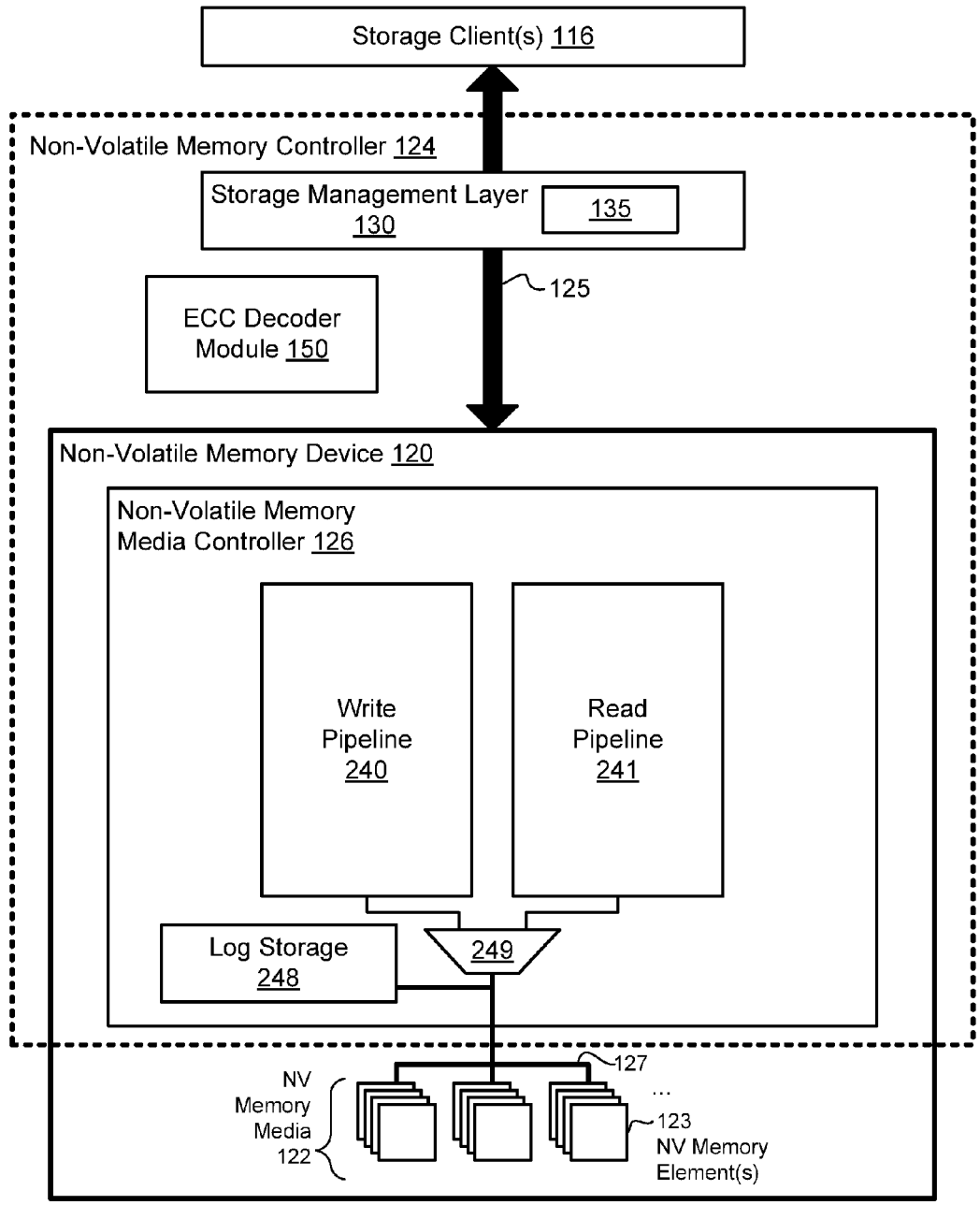
FIG. 2 is a schematic block diagram illustrating another embodiment of a system comprising an ECC decoder module.

FIG. 2 depicts another embodiment of a non-volatile memory controller 124 configured to decode data using an error correcting code. The non-volatile memory device 120 may comprise a non-volatile memory media controller 126 and non-volatile memory media 122. The non-volatile memory media 122 may comprise a plurality of non-volatile memory elements 123, which may be communicatively coupled to the non-volatile memory media controller 126 via a bus 127, as described above.

The non-volatile memory media controller 126 may comprise a write pipeline 240 that is configured to store data on the non-volatile memory media 122 in a contextual format in response to requests received via bus 125. The requests may include and/or reference data to be stored on the non-volatile memory media 122, may include logical address(es) of the data, and so on. As described above, the contextual format may comprise storing a logical address of the data in association with the data on the non-volatile memory media 122. For example, the write pipeline 240 may be configured to format data into packets, and may include the logical address of the data in a packet header or other packet field. The write pipeline 240 may be configured to buffer data for storage on the non-volatile memory media 122. In some embodiments, the write pipeline 240 may comprise one or more synchronization buffers to synchronize a clock domain of the non-volatile memory media controller 126 with a clock domain of the non-volatile memory media 122 and/or bus 127.

The log storage module 248 may be configured to select media location(s) for the data and may provide addressing and/or control information to the non-volatile memory elements 123 via the bus 127. In some embodiments, the log storage module 248 is configured to store data sequentially in a log format within the non-volatile memory media. The log storage module 248 may be further configured to groom the non-volatile memory media, as described above. In certain embodiments the log storage module 248 is substantially similar to the log storage module 137 as described above. The log storage module 248 may be executed by the SML 130 and/or by the non-volatile memory media controller 126.

Upon writing data to the non-volatile memory media, the non-volatile memory media controller 126 may be configured to update metadata 135 (e.g., a forward index) to associate the logical address(es) of the data with the media address(es) of the data on the non-volatile memory media 122. In some embodiments, the metadata 135 may be maintained on the non-volatile memory media controller 126; for example, the metadata 135 may be stored on the non-volatile memory media 122, on a volatile memory (not shown), or the like. Alternatively, or in addition, the metadata 135 may be maintained within the SML 130 (e.g., on a volatile memory 112 of the computing device 110 of FIG. 1). In some embodiments, the metadata 135 may be maintained in a volatile memory by the SML 130, and may be periodically stored on the non-volatile memory media 122.

The non-volatile memory media controller 126 may further comprise a read pipeline 241 that is configured to read contextual data from the non-volatile memory media 122 in response to requests received via bus 125. The requests may comprise a logical address of the requested data, a media address of the requested data, and so on. The read pipeline 241 may be configured to read data stored in a contextual format from the non-volatile memory media 122 and to provide the data to the SML 130 and/or a storage client 116. The read pipeline 241 may be configured to determine the media address of the data using a logical address of the data and the metadata 135. Alternatively, or in addition, the SML 130 may determine the media address of the data and may include the media address in the request. The log storage module 248 may provide the media address to the non-volatile memory elements 123, and the data may stream into the read pipeline 241 via a buffer. The read pipeline 241 may comprise one or more read synchronization buffers for clock domain synchronization, as described above.

The non-volatile memory media controller 126 may further comprise a multiplexer 249 that is configured to selectively route data and/or commands to/from the write pipeline 240 and the read pipeline 241. In some embodiments, non-volatile memory media controller 126 may be configured to read data while filling a buffer of the write pipeline 240 and/or may interleave one or more storage operations on one or more banks of non-volatile memory elements 123 (not shown).

Figure 3:
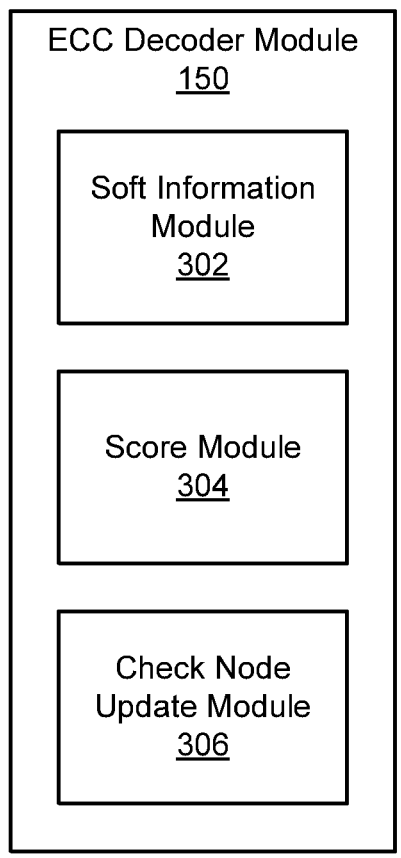
FIG. 3 is a schematic block diagram illustrating one embodiment of an ECC decoder module.

FIG. 3 depicts one embodiment of an ECC decoder module 150. The ECC decoder module 150 may be substantially similar to the ECC decoder module 150 described above with regard to FIGS. 1 and 2. In general, as described above, the ECC decoder module 150 decodes data by selectively receiving soft information or another indication of accuracy for variable nodes, assigning scores to the variable nodes based on the soft information and on unsatisfied check nodes, and toggling check nodes based on the scores. The ECC decoder module 150 may iteratively update the scores and the check nodes until it decodes the data or reaches an iteration limit. For example, in one embodiment, each iteration may include assigning new or updated scores to variable nodes, and updating or toggling check nodes based on the scores. LDPC code decoding is described in greater detail below. In the depicted embodiment, the ECC decoder module 150 includes a soft information module 302, a score module 304, and a check node update module 306.

The soft information module 302, in one embodiment, is configured to determine, read, obtain, or otherwise receive soft information, soft data, or another indication of accuracy for a data value or variable node of a low density parity check (LDPC) code decoder. In certain embodiments, the soft information module 302 may be configured to determine soft information or other indication of accuracy for a plurality of variable nodes. Additionally, in a certain embodiment, the soft information module 302 may determine whether to obtain the soft information or other indication of accuracy for data values in a code word, based on an estimated number of errors for the code word. As described in greater detail below with regard to the precision selection module 408, an estimated number of errors for a code word or other set of data may comprise an actual or predicted amount of errors for the set of data. In one embodiment, the score module 304 and the check node update module 306 may correct errors in the received code word using the ECC decoder to perform soft-decision decoding based on the soft data, in response to the soft information determining to obtain the soft information. In a further embodiment, the score module 304 and the check node update module 306 may correct errors in the received code word using the ECC decoder to perform hard-decision decoding based on the soft data, in response to the soft information module 302 determining not to obtain the soft information. In various embodiments, a means for reading soft data, or for determining whether to obtain soft data or another indication of accuracy, may include a soft information module 302, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for reading soft data.

In one embodiment, an LDPC code decoder may include a plurality of variable nodes associated with a plurality of check nodes. A node, as used herein, may comprise a logical or mathematical construct, data structure, or unit. A node may comprise a vertex or point in a mathematical graph, at which lines or connections intersect, branch, and/or terminate. An LDPC decoder may use variable nodes associated with check nodes to detect and/or correct errors in data bits. The terms "message node," "data node," or "subcode node" may also be used herein to refer to a variable node, and the terms "digit node" or "check bit" may refer to a check node. In another embodiment, the term "check bit" may also refer to a redundant bit of a received code word, corresponding to one of the variable nodes. In a certain embodiment, the plurality of variable nodes may correspond to bits or data values of a received code word. Accordingly, terms for "data values" and terms for "variable nodes" may be used interchangeably herein. For example, in one embodiment, a code word may be encoded data of the non-volatile memory device 120, and the LDPC code decoder may receive the code word from the non-volatile memory media 122 via a bus 127. Although LDPC encoding and decoding is described herein for correcting errors related to data storage using a non-volatile memory device 120, this use is intended as illustrative and not limiting; the ECC decoder module 150 may, in various embodiments, be used in systems other than those depicted in FIGS. 1 and 2 to correct errors related to telephone or other audio transmissions, television or other video transmissions, internet communications, wired or wireless Ethernet communications, microwave communications, satellite or deep space communications, optical data storage, magnetic data storage, error correcting volatile memory, data storage using other types of data storage device, other communications channels, or the like. For example, in another embodiment, a code word may be encoded data of a video signal received from a satellite transmitter.

In some embodiments, an LDPC encoder may generate an original code word by multiplying, modulo 2, a binary generator matrix, and an original, unencoded binary message. Storage, transmission, or other noisy communication processes may cause the original code word to be received by the LDPC code decoder with errors. The term "received code word" may be used herein to refer to an original code word plus zero or more errors, as received by the LDPC code decoder. Thus, a "received code word" may not be a code word of the LDPC code (e.g., a possible product, modulo 2, of the generator matrix and any possible message) due to the errors, but may still be referred to herein as a "received code word" because it is the version of the original code word that an LDPC code encoder generated and that the LDPC code decoder receives.

Each variable node of the LDPC code decoder may store or track a value associated with a bit from a received code word. In certain embodiments, the LDPC code decoder uses the association between the variable nodes and the check nodes to update the variable nodes, thus recovering the original code word without errors. Another matrix multiplication, applied to the recovered code word, may reverse the effect of the generator matrix and produce the decoded message.

A parity check matrix may describe the association between the variable nodes and the check nodes. Each column of the parity check matrix may correspond to a variable node, and each row of the parity check matrix may correspond to a check node. An element in a row and column of the parity check matrix may be a binary value, so that a one indicates that the check node for the row and the variable node for the column are associated, and a zero indicates that the check node for the row and the variable node for the column are not associated. Equivalently, the parity check matrix may describe relationships between the data values or variable nodes, so that a check node indicates a relationship between the data values or variable nodes with which the check node is associated The product, modulo 2, of the parity check matrix and a column vector of values for the variable nodes may produce values that are stored or tracked by the check nodes. In one embodiment, the LDPC code decoder may use hardware and algorithms generally capable of matrix multiplication to generate values for the check nodes. In another embodiment, the LDPC code decoder may equivalently determine the value of a check node by adding, modulo 2, the binary values of each variable node with which the check node is associated. Because an exclusive OR (XOR) operation is equivalent to addition modulo 2 of binary digits, the LDPC code decoder may, in some embodiments, determine values for each check node by performing a series of XOR operations.

If the value of each check node is zero, then the values of the variable nodes correspond to bits of a valid code word for the LDPC code, and the LDPC code decoder may recover a message from the valid code word. As used herein, a "satisfied" check node may refer to a check node with a value of zero, and an "unsatisfied" check node may refer to a check node with a value of one. Similarly, a parity check matrix, or the relationships between variable nodes or data values described by the parity check matrix, may be described as "satisfied" if its check nodes are satisfied. Thus in certain embodiments, the original code word may be recovered without errors when the check nodes are satisfied. A satisfied check node may indicate that the sum of the values of the variable nodes associated with the check node is even. An unsatisfied check node may indicate that the sum of the values of the variable nodes associated with the check node is odd. Equivalently, the relationship between data values or variable nodes associated by a check node of the parity matrix is satisfied if the sum of the data values is even. In some embodiments, the LDPC code decoder may change values of the variable nodes based on which check nodes are unsatisfied, until all the check nodes are satisfied.

The parity check matrix may be a sparse matrix, including mostly zeroes. A column weight or row weight may refer to the number of binary ones in each column or row respectively. Thus, the column weight may indicate the number of check nodes associated with each variable node, and the row weight may indicate the number of variable nodes associated with each check node. For example, in one embodiment, a parity check matrix may have a column weight of 4 and a row weight of 56, so that each variable node is associated with 4 check nodes, and each check node is associated with 56 variable nodes. In another embodiment, a parity check matrix may have a column weight of 5 and a row weight of 70, so that each variable node is associated with 5 check nodes, and each check node is associated with 70 variable nodes. In various embodiments, an LDPC code decoder may use any of various column weights and row weights. Larger column weights and row weights may indicate a more complex association between the variable nodes and the check nodes, resulting in increased error correction performance but also resulting in increased computational complexity for the LDPC code decoder. In one embodiment, an LDPC code for the LDPC code decoder may be a regular LDPC code, where the column weight is constant for each column of the parity check matrix and the row weight is the constant for each row. In another embodiment, the LDPC code may be an irregular LDPC code, where the column weight and/or the row weight may vary within the parity check matrix.

In one embodiment, the parity check matrix may be selected to provide low computational complexity for the LDPC code decoder. For example, in a certain embodiment, the parity check matrix for the LDPC code decoder may be divided into sub-matrices so that a sub-matrix is either a cyclically shifted identity matrix or a zero matrix. A cyclically shifted identity matrix, in various embodiments, may include the identity matrix itself, or any version of the identity matrix shifted cyclically in any direction. Thus, an N by N cyclically shifted identity matrix may include N ones, either on the main diagonal, or on two diagonals, with zeroes elsewhere, so that each row and column includes 1 one and N−1 zeroes. An N by N cyclically shifted identity matrix, in further embodiments, may be a special case of an N by N circulant matrix, which is specified by an N-element column vector that appears in the first column and is shifted cyclically downward in remaining columns with an offset equal to the column index. Thus, an N by N cyclically shifted identity matrix may be an N by N circulant matrix specified by an N-element column vector that includes 1 one, in any position, and N−1 zeroes.

In some embodiments, if the parity check matrix is a matrix of N by N sub-matrices, then multiplying N times the row weight gives the code word size, or number of variable nodes, and multiplying N times the column weight gives the number of check nodes for the LDPC code decoder. In one embodiment, continuing the column weight 4 example introduced above, a parity check matrix may comprise 5 rows and 70 columns of 256 by 256 sub-matrices, where the 5 sub-matrices in a column include 4 cyclically shifted identity matrices and 1 zero matrix, and the 70 sub-matrices in a row include 56 cyclically shifted identity matrices and 14 zero matrices. Thus, the LDPC code decoder in this embodiment may handle code words of 17,920 bits using 17,920 variable nodes and 1,280 check nodes. In another embodiment, continuing the column weight 5 example introduced above, the LDPC code decoder may also handle code words of 17,920 bits using 17,920 variable nodes and 1,280 check nodes, with a parity check matrix comprising 5 rows and 70 columns of 256 by 256 sub-matrices, where each sub-matrix is a cyclically shifted identity matrix, and none of the sub-matrices are zero. In various embodiments, LDPC code decoders may handle various sizes of code words, numbers of variable nodes, and numbers of check nodes using various sizes of parity check matrices of varying column weights and row weights, with sub-matrices including cyclically shifted identity matrices and/or zero matrices.

Quasi-cyclic LDPC codes based on cyclically shifted identity matrices provide low computational complexity for an LDPC code decoder because applying a cyclically shifted identity matrix to a vector results in cyclically shifting the vector. Similarly, applying a zero matrix to a vector results in a zero vector. Therefore, in some embodiments, if the parity check matrix is a matrix of N by N sub-matrices including cyclically shifted identity matrices and/or zero matrices, calculating values for the check nodes may involve grouping the check notes and the variable nodes into groups of size N. Then, the LDPC code decoder may calculate values for each group of N check nodes by shifting the group of N variable nodes according to a corresponding cyclically shifted identity matrix, and adding the shifted values modulo 2, or by ignoring the group of N variable nodes according to a corresponding zero matrix. Thus, in a certain embodiment, an LDPC code decoder may calculate values for check nodes by shifting and adding certain groups of variable nodes. In a further embodiment, computational hardware for an LDPC code decoder may include barrel shifters (or other types of shifters) and adders for calculating values of check nodes by shifting and adding groups of variable nodes.

In some embodiments, an LDPC code decoder changes the values of some variable nodes in response to unsatisfied check nodes. In further embodiments, the LDPC code decoder may iteratively update variable nodes and recalculate values for check nodes until the check nodes are satisfied or the LDPC code decoder reaches an iteration limit. In certain embodiments, if sub-matrices of the parity check matrix are cyclically shifted identity matrices and/or zero matrices, the LDPC code decoder may handle a number of variable nodes corresponding to a size of one of the sub-matrices in each iteration. As used herein, a (one-dimensional) number of variable nodes corresponds to the size of a (two-dimensional) sub-matrix if the number of variable nodes is equal to the number of rows or columns of the sub-matrix. For example, in one embodiment, if each of the sub-matrices is an N by N matrix, the LDPC code decoder may update a group of N variable nodes, and update the corresponding check nodes in groups of N check nodes by applying each sub-matrix in the column corresponding to the group of N variable nodes. In a further embodiment, with the check nodes updated, the LDPC code decoder may handle another group of N variable nodes in the next iteration, updating the new group of N variable nodes, updating the corresponding check nodes, and so on. Thus, in certain embodiments, each iteration of the score module 304 and the check node update module 306 may handle a number of variable nodes corresponding to a size of one of the sub-matrices.

As described above, in various embodiments, the soft information module 302 may be configured to determine, read, obtain, or otherwise receive soft information, soft data, or another indication of accuracy for the variable nodes. In certain embodiments, "soft information," "soft data," an "accuracy indication," and/or an "indication of accuracy" for a variable node may indicate strength, reliability, or accuracy for the corresponding bit of the received code word (e.g., a likelihood or probability that the bit is correct). For example, in one embodiment, soft information or another indication of accuracy may include a bit from a received code word and an indication of whether that bit is "strong" or "weak" (e.g., more likely to be correct or less likely to be correct, respectively). In another embodiment, soft information or another indication of accuracy may include a bit and an indication of whether that bit is strong, weak, or intermediate-strength. Terms such as "hard information," "hard data" and the like may be used herein to refer to the received bit alone, without an indication of accuracy. "Soft information," "soft data" and the like may refer either to the indication of accuracy alone, or to the hard data bit plus an indication of accuracy.

In one embodiment, a bit may be stored by a cell of a non-volatile memory medium 122, and the soft information module 302 may read the soft information or another indication of accuracy from the cell by using a plurality of read thresholds. Read thresholds are described further below with regard to FIG. 6. For example, in one embodiment, soft information, soft data or another indication of accuracy may include a probability value, with values closer to one indicating a higher probability that the corresponding bit is a binary one and values closer to zero indicating a higher probability that the corresponding bit is a binary zero. In another embodiment, soft information, soft data, or another indication of accuracy may comprise a vector that includes both a direction indicating bit value (e.g., positive for a binary zero and negative for a binary one or vice versa) and a magnitude indicating a probability or confidence that the direction indicating bit value is correct. Soft information, soft data, or another indication of accuracy, in one embodiment, may include an actual or approximate stored read voltage level for a cell, in volts or the like. In light of this disclosure, many different types and configurations of soft information or another indication of accuracy that a soft information module 302 may receive, in various embodiments, are clear.

The score module 304, in one embodiment, is configured to determine, calculate, assign, update or otherwise associate a score with a data value or variable node. A score, as used herein, comprises an indicator, value, or other data structure that tracks, stores, or represents an estimated or determined likelihood or probability that a data value should be toggled, flipped, or otherwise corrected (e.g., that a data bit is in error). In various embodiments, a means for determining a score may include a score module 304, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for determining a score for a variable node.

In certain embodiments, logic hardware of the score module 304 may store the score using a register, volatile memory, or the like. In a further embodiment, the score module 304 may iteratively calculate scores for the data values or variable nodes. In various embodiments, the score module 304 may assign a score to one, some, or all of the variable nodes. In certain embodiments, assigning scores to variable nodes may generate updated estimates of the likelihood or probability that the corresponding bits in the received code word are correct, similar to the initially-received soft information, thus allowing an LDPC code decoder to use soft information while avoiding delays and higher computational complexity associated with explicitly propagating the soft information through the LDPC code decoder (e.g., by explicitly passing messages among nodes). Accordingly, in some embodiments, using the score module 304 to assign scores to a larger number of variable nodes will increase the performance of a soft-decision LDPC code decoder.

In a certain embodiment, the score for a variable node may be based on the soft information or another indication of accuracy for the variable node and on the count of unsatisfied check nodes associated with the variable node. In some embodiments, the score module 304 may assign scores based on the accuracy indications or soft information, and may update the scores based on the relationships, described by the parity check matrix, between the data values (e.g., each check node may associate a group of data values or variable nodes together). For example, in one embodiment, an initial, or early score for a variable node may be based on the soft information or another indication of accuracy for the variable node, and a subsequent score may be based on a previous score and on a count of unsatisfied check nodes associated with the variable node. In such an embodiment, the soft information or another indication of accuracy is propagated from the initial, or early score to subsequent scores because the subsequent scores are based on previous scores. Thus, subsequent scores may be based on both the soft information (or another indication of accuracy) and the count of unsatisfied check nodes associated with the variable node. Initial and subsequent scores are described in further detail below with regard to FIGS. 4 and 5. In another embodiment, the ECC decoder module 150 may use the score module 304 to perform hard-decision decoding by assigning scores based on the unsatisfied check nodes, without using soft information or another indication of accuracy. For example, the score module 304 may initialize the scores to zero, an initial count of unsatisfied check nodes for each variable node, or another value, in response to the soft information module 302 determining not to obtain soft information or another indication of accuracy for the code word. In some embodiments, hard-decision decoding may provide higher error correction speeds by avoiding the delay involved in obtaining the soft information, at the cost of lower error correction capability. Thus, by dynamically adjusting to obtain and use the soft information or not, the soft information module 302 and the score module 304 allow the ECC decoder module 150 to dynamically adapt between hard-decision and soft-decision decoding, for faster decoding, or higher error correction capability, respectively.

In some embodiments, the score for a variable node may include a multiple-bit value. For example, in one embodiment, the score may include a three-bit value in a range from 0 to 7. In another embodiment, the score may include a seven-bit value in a range from 0 to 127. In a further embodiment, the score may include a seven-bit value capable of expressing scores from 0 to 127, but may be restricted to a smaller range. In another embodiment, the score may include a value with another bit width, or a value restricted to a different range of possible values. In one embodiment, the score module 304 may cooperate with the precision selection module 408, as described below with regard to FIG. 4, to select a precision, an estimated precision, a bit width, a range of possible values for the scores or the like, based on an estimated number of errors for the received code word.

The score for a data value or variable node, in one embodiment, may indicate an estimated probability that the data value, or the bit of the received code word corresponding to the variable node, is in error. Conversely, in another embodiment, the score may indicate a determination or estimate that the corresponding bit of the received code word is not in error. Thus, in certain embodiments, the soft information or another indication of accuracy from the soft information module 302 may indicate an initial probability that the corresponding bit is correct, and the score from the score module 304 may indicate an updated probability that the corresponding bit is correct.

In one embodiment, a score threshold may divide the range of possible values for a variable node's score into two sub-ranges, so that a score in the first sub-range indicates a lower estimated probability that the corresponding bit is in error, and a score in the second sub-range indicates a higher estimated probability that the bit is in error. A score in the second sub-range may be said to "satisfy" the score threshold, indicating an estimation that the bit is likely in error. For example, in a certain embodiment, continuing the three-bit score example introduced above, a score from four to seven (e.g., the most significant bit of the score is a binary one), may indicate that the corresponding bit of the received code word is likely in error, and a score from zero to three (e.g., the most significant bit of the score is a binary zero) may indicate that the corresponding bit is likely correct. Although a score in the higher sub-range in this example indicates a higher probability that a bit is in error, the relationship between the score and the estimated probability may be reversed, in another embodiment, so that a score in the lower sub-range indicates that a bit is in error. Score thresholds and ranges of possible score values are described further below with regard to FIGS. 4 and 5.

In some embodiments, the estimated probability that a bit is in error may or may not be correct for any given iteration of the LDPC code decoder, but may change and/or improve as the score is updated in further iterations. In one embodiment, in a first iteration of the score module 304, the score module 304 may set the first score for a variable node to zero, the number of unsatisfied check nodes associated with the variable node, a value based on the soft information from soft information module 302, or another value, as an initial estimate of the probability that the corresponding bit is in error.

In a certain embodiment, if the number of errors in the received code word is small, then a high count of unsatisfied check nodes associated with a variable node may indicate that the corresponding bit of the received code word is likely to be in error, and a low count of unsatisfied check nodes may indicate that the corresponding bit is likely correct. In another embodiment, if the received code word includes a larger number of errors, the count of unsatisfied check nodes associated with a variable node may be low even if the corresponding bit is in error, due to associations of the check nodes with other variable nodes also corresponding to erroneous bits of the received code word. Thus, in a further embodiment, in a further iteration of the score module 304, the score module 304 may update, redetermine, or reassign the score based on an updated count of unsatisfied check nodes associated with the variable node, in response to the check node update module 306 updating the check nodes, as described below.

In one embodiment, the score module 304 may calculate or assign the score for a variable node in one iteration by using a function that determines the score based on a previous score for the variable node and on the count of unsatisfied check nodes associated with the variable node. As used herein, a "function" that determines the score refers to any logic, method, algorithm, or procedure that returns a score based on the previous score and the count of unsatisfied check nodes. For example, in one embodiment, a function may include arithmetically calculating a score. In another embodiment, a function may include looking up a score using a pre-computed table that maps input values to output values. "Mapping," as used herein, also refers to a function. Thus, in various embodiments, a function for assigning the score may be any mapping from the previous score and the count of unsatisfied check nodes associated with the variable node, to a current score. Functions or mappings used by the score module 304 for assigning a score are described in further detail below with regard to the function select module 410 of FIG. 4, and with regard to FIG. 5.

In one embodiment, the score module 304 may update or toggle the value for a variable node, or track whether the value for a variable node is flipped or un-flipped relative to the corresponding bit in the received code word. In a further embodiment, the score module 304 may iteratively update, revise, or toggle one or more of the variable nodes based on the scores. In various embodiments, a means for toggling a variable node may include a score module 304, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for updating or toggling a variable node.

In one embodiment, the value for a variable node may include a bit that is flipped or un-flipped relative to the corresponding bit of the received code word, based on the score, or the estimated probability that the corresponding bit is in error. In another embodiment, the flipped or un-flipped value may not be stored directly, but may be computed by the score module 304 based on a mask bit or flag indicating whether the value for the variable node is flipped or un-flipped relative to the corresponding bit of the received code word. In a further embodiment, where the range of possible values for the score is divided into sub-ranges by a score threshold, as described above, the score module 304 may avoid setting or clearing a mask bit or flag, by determining whether the score is in the first or second sub-range, so that a score in the first sub-range (e.g., indicating that the corresponding bit is likely correct) indicates that the value for the variable node is un-flipped relative to the corresponding bit, and a score in the second sub-range (e.g., indicating that the corresponding bit is likely in error) indicates that the value for the variable node is flipped relative to the corresponding bit. For example, in one embodiment, the score may be a seven-bit value in a range from 0 to 127, with a score threshold of 64, so that the most significant bit of the score indicates whether the variable node should be flipped or un-flipped relative to the received bit. In another embodiment, the score may be a seven-bit value in a range from 0 to 127, with a score threshold of 120, so that the value for the variable node is un-flipped relative to the received bit if the score is below 120, and flipped relative to the received bit if the score is 120 or above. In light of this disclosure, many ways of updating, toggling, or tracking a value for a variable node are clear that the score module 304 may use, in various embodiments.

In certain embodiments, "updating" a variable node may refer to changing the value of the variable node (e.g., by flipping a bit), determining not to change the value of the variable node (e.g., by not flipping a bit), determining whether to change a value of the variable node, computing a function of the score for the variable node and the corresponding bit of the received code word, determining whether a bit of the variable node should match or invert the corresponding bit of the received code word, or the like. Thus, in one embodiment, the score module 304 may update a variable node by changing the value of the variable node, but in another embodiment, or in another iteration, the score update module 304 may update a variable node by leaving the value of the variable node unchanged.

In one embodiment, the score module 304 may update a variable node based on the score by determining whether the score satisfies a score threshold (e.g., the score is in the second sub-range described above), to determine whether to flip a bit value for the variable node relative to the corresponding bit of the received code word. In some embodiments, the score module 304 may assign a variable node a flipped value relative to the corresponding bit of the received code word in response to the score satisfying the score threshold. As used herein, a "flipped" bit or value refers to an inverted value relative to a value for a bit in the received code word. For example, if a bit from the received code word is a binary zero, and the corresponding variable node is "flipped", then the value of the variable node is changed to a binary one. In further embodiments, the score update module 304 may assign a variable node an un-flipped value relative to the corresponding bit of the received code word, in response to the score failing to satisfy the score threshold (e.g., the score is in the first sub-range described above).

Thus, in one embodiment, updating a variable node may include toggling the variable node in response to the score crossing a score threshold. As used herein, "toggling" or "flipping" refers to changing a binary value from a zero to a one or from a one to a zero. In one embodiment, the score module 304 may use an exclusive OR (XOR) operation to toggle a variable node. Thus, in certain embodiments, logic hardware for the score module 304 may include adders, XOR gates, or the like.

Also, as used herein, "crossing a score threshold" refers to a score satisfying a score threshold when the previous score did not satisfy the score threshold (or with no previous score) and/or to a score failing to satisfy a score threshold when the previous score did satisfy the score threshold. So, if the score for a variable node crosses the score threshold, the score module 304 may toggle the bit value for the variable node from a flipped to an un-flipped state (or vice versa), relative to the corresponding bit of the received code word.

In one embodiment where a high score indicates an estimated probability that the corresponding bit of the received code word is in error, the score may satisfy a score threshold if the score is greater than or equal to a threshold value, and may fail to satisfy the score threshold if the score is less than the threshold value. For example, continuing the three-bit score example described above, where the score is in a range from zero to seven, the threshold value may be four, so that a score greater than or equal to four may satisfy the score threshold, and a score less than four may fail to satisfy the threshold. In various embodiments, the score module 304 may use various score thresholds to determine whether to flip a bit value for the variable node.

In one embodiment, if the score for a variable node is high, then the corresponding bit of the received code word is estimated to be in error. Thus, in a further embodiment, the score module 304 determines that the bit value for the variable node should be flipped in comparison to the corresponding bit of the received code word, in response to the score satisfying the score threshold. In still further embodiments, if the score for a variable node is low, then the corresponding bit of the received code word is estimated to be correct. Thus, in some embodiments, the score module 304 determines that the bit value for the variable node should not be flipped in comparison to the corresponding bit of the received code word, in response to the score failing to satisfy the score threshold. In either case, having determined whether the variable node value should be flipped in comparison to the corresponding bit in the received code word, the score module 304 may compare the value of the variable node to the bit of the received code word, and update the variable node accordingly.

The check node update module 306, in one embodiment, is configured to toggle check nodes associated with a variable node in response to the score for the variable node crossing the score threshold, or to otherwise update or revise check nodes based on the scores. In one embodiment, the check node update module 306 may update check nodes based on an updated or revised variable node. In another embodiment, the check node update module 306 may update or revise check nodes based directly on the scores, by toggling the check nodes associated with a variable node if the score for the variable node crosses a score threshold. In a further embodiment, the check node update module 306 may iteratively update or revise one or more of the check nodes based on the scores. In various embodiments, a means for updating check nodes based on the scores may include a check node update module 306, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for updating check nodes.

In various embodiments, "updating" a check node may refer to determining an updated value for a check node based on the updated variable nodes, whether or not the check node update module 306 changes the value of the check node. As described above, the value of a check node may be binary one or zero, based on the product, modulo 2, of the parity check matrix and the variable nodes. Thus in one embodiment, if the score module 304 assigns a score that crosses the score threshold (relative to a previous score) to an odd number of the variable nodes connected to a check node, in one iteration, then the check node update module 306 may update the check node by toggling the binary value of the check node. In another embodiment, or in another iteration, if the score module 304 assigns a score that crosses the score threshold (relative to a previous score) to an even number of the variable nodes connected to the check node, then the check node update module 306 may update the check node by leaving the value of the variable node unchanged.

In certain embodiments, as described above, the parity check matrix may be a matrix of N by N sub-matrices, where the sub-matrices are cyclically shifted identity matrices or zero matrices. In some embodiments, the score module 304 may assign a score to a group of N variable nodes, and update the group of N variable nodes based on the scores. The check node update module 306 may update a group of N check nodes by applying the N by N sub-matrix corresponding to the group of N check nodes and the group of N variable nodes to the group of N variable nodes. If the corresponding sub-matrix is zero, the check node update module 306 may leave the group of N check nodes unchanged. If the corresponding sub-matrix is a cyclically shifted identity matrix, the check node update module 306 may update the group of N check nodes by reading the group of N updated variable nodes (e.g., reading the corresponding bits of the received code word from a register and comparing the scores to the score threshold to determine whether the variable node values are flipped or un-flipped relative to the received bits), shifting the group of variable nodes according to the cyclically shifted identity matrix, and adding the result, modulo 2, (e.g., by performing an XOR operation) to previously calculated values for the check nodes. On a first iteration, in one embodiment, the check node update module 306 may preprocess the check nodes, or make an initial calculation of check node values, by applying the relevant sub-matrix to each group of N variable nodes and adding the results modulo 2. Then, in further iterations, or in a further embodiment, the score module 304 and check node update module 306 may handle a number of variable nodes in each iteration corresponding to the size of one of the sub-matrices, so that if the sub-matrices are N by N matrices, the score module 304 and check node update module 306 may handle groups of N variable nodes and N check nodes. Accordingly, in a certain embodiment, logic hardware for a check node update module 306 may include barrel shifters (or other types of shifters) and adders for calculating values of check nodes by shifting and adding groups of variable nodes.

In one embodiment, the score module 304 and check node update module 306 may proceed to a subsequent iteration after handling a group of N variable nodes. In a further embodiment, the next iteration may include assigning a score (or updating the score) for the next group of N variable nodes, and updating the check nodes based on the updated scores. In one embodiment, the check node update module 206 may update the check nodes in groups of N check nodes, but may proceed to update each group of N check nodes by applying each N by N sub-matrix in the column of sub-matrices corresponding to the group of N variable nodes, before handling a subsequent group of N variable nodes. An LDPC code decoder iterating for each group of N variable nodes may provide high error correcting performance, as updates for previous groups of N variable nodes are propagated, via scores based on the updated check nodes, to a current group of N variable nodes. Accordingly, an LDPC code decoder iterating for each group of N variable nodes may correct errors efficiently, without explicitly passing messages among variable nodes and check nodes.

In one embodiment, the ECC decoder module 150 may be an LDPC code decoder, and the soft information module 302, score module 304, and check node update module 306 may be modules of the LDPC code decoder. Thus, in a certain embodiment, the LDPC code decoder may determine whether to obtain soft information or another indication of accuracy for a code word, receive the soft information or another indication of accuracy, assign and/or update scores for the variable nodes, and update associated check nodes. In one embodiment, the LDPC code decoder may be a software decoder. For example, in a further embodiment, a driver, such as the SML 130 may implement a software LDPC code decoder for the computing device 110. In another embodiment, the LDPC code decoder may be implemented using a mixture of hardware and software elements. In certain embodiments, the LDPC code decoder may be a hardware decoder. For example, in one embodiment, the LDPC code decoder may be implemented using hardware of the non-volatile memory media controller 126, such as a field-programmable gate array (FPGA) or other programmable logic, firmware for an FPGA or other programmable logic, microcode for execution on a microcontroller, an application-specific integrated circuit (ASIC), or the like. In a certain embodiment, the LDPC code decoder may include logic hardware and/or executable code. In a further embodiment, the executable code may be stored on a computer readable storage medium.

Figure 4:
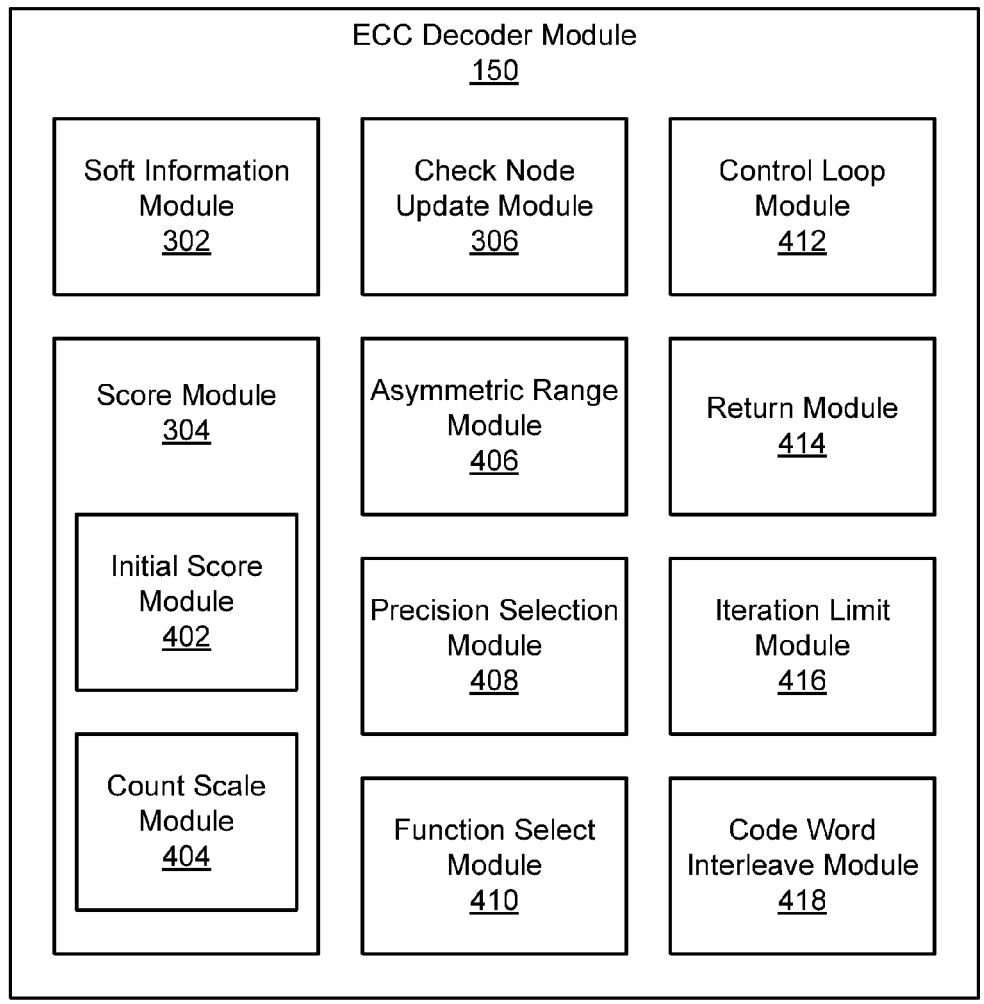
FIG. 4 is a schematic block diagram illustrating another embodiment of an ECC decoder module.

FIG. 4 depicts another embodiment of an ECC decoder module 150. The ECC decoder module 150, in certain embodiments, may be substantially similar to the ECC decoder module 150 described above with regard to FIG. 1, FIG. 2, and/or FIG. 3. In the depicted embodiment, the ECC decoder module 150 includes a soft information module 302, a score module 304, and a check node update module 306, which may be configured substantially as described above with regard to FIG. 3. The score module 304, in the depicted embodiment includes an initial score module 402 and a count scale module 404. The ECC decoder module 150, in the depicted embodiment, includes an asymmetric range module 406, a precision selection module 408, a function select module 410, a control loop module 412, a return module 414, an iteration limit module 416, and a code word interleave module 418.

The score module 304, in one embodiment may use the initial score module 402 to determine, assign, calculate, or otherwise associate an initial score with a variable node. In some embodiments, the initial score module 402 may be configured to determine or assign an initial score for a variable node based on soft information or another indication of accuracy for the variable node received or determined by the soft information module 302. In various embodiments, a means for determining an initial score may include an initial score module 402, a score module 304, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for determining an initial score for a variable node based on soft data or another indication of accuracy.

As used herein, the term "initial score" may refer to a score in a first iteration of the score module 304, or may refer to another early score for the variable node in a subsequent of the score module 304. For example, in one embodiment, the score module 304 may use the initial score module 402 to assign a first score to the variable node based on soft information or another indication of accuracy. In another embodiment, however, the score module 304 may set the first score for the variable node to zero, to the number of unsatisfied check nodes associated with the variable node or to another number, and may use the initial score module 402 to determine a second score for the variable node by adjusting the first score based on soft information or another indication of accuracy, in a subsequent iteration. In either case, however, the score module 302 may be said to have assigned an "initial score" based on the soft information or another indication of accuracy, regardless of whether the "initial score" is actually the first score, a second score, or another early score. In certain embodiments, the score for a variable node provides an updatable estimate of the probability that the corresponding bit of the received code word is in error, similar to the initially-received soft information or another indication of accuracy, so including the soft information or another indication of accuracy in earlier scores may increase the accuracy of the estimated probability for subsequent scores.

In one embodiment, the initial score module 402 may assign an initial score for a variable node that indicates a higher estimated probability that the corresponding bit is in error if the soft information or another indication of accuracy indicates a lower accuracy for the bit, or may assign an initial score that indicates a lower estimated probability that the bit is in error if the soft information or another indication of accuracy indicates a higher accuracy for the bit. For example, in a certain embodiment, the initial score module 402 may be configured to select an initial score for a variable node from two different possible initial scores based on whether the soft information or another indication of accuracy received or determined by the soft information module 302 indicates a higher or lower accuracy for the corresponding bit. As another example, in another embodiment, the initial score module 402 may be configured to select an initial score for a variable node from three different possible initial scores based on whether the soft information or another indication of accuracy indicates a high, low, or intermediate accuracy for the corresponding bit. In a further embodiment, the soft information or another indication of accuracy may be a value between zero and one, and the initial score module 402 may use the soft information or another indication of accuracy as a scale factor to determine an initial score. In view of this disclosure, many ways for the initial score module 402 to assign an initial score based on soft information or another indication of accuracy are clear.

In one embodiment, as described above, the score threshold may divide a range of possible values for the score into a first sub-range of values indicating lower estimated probabilities that the corresponding bit is in error and a second sub-range of values indicating higher estimated probabilities that the bit is in error. In a further embodiment, the initial score module 402 may assign initial scores in the first sub-range, so that the check node update module 306 calculates initial values for the check nodes based on the un-flipped bits of the received code word. A subsequent score crossing the score threshold into the second sub-range might then indicate a flipped value for the variable node, relative to the received bit, leading the check node update module 306 to toggle the associated check nodes.

In a further embodiment, the initial score module 402 may assign different initial scores in the first sub-range based on the soft information or another indication of accuracy. For example, in one embodiment, the initial score module 402 may assign a variable node an initial score in the first sub-range that is closer to the score threshold, in response to the soft information or another indication of accuracy indicating a lower accuracy for the corresponding bit of the received code word, and may assign an initial score in the first sub-range that is further from the score threshold, in response to the soft information or another indication of accuracy indicating a higher accuracy for the bit. In a further embodiment, the initial score module 402 may assign an initial score in the first sub-range at an intermediate distance from the score threshold in response to the soft information or another indication of accuracy indicating an intermediate accuracy for the bit. In certain embodiments, a score that is initialized closer to the score threshold may cross the score threshold in fewer iterations than a score that is initialized further from the score threshold. Thus, by assigning initial scores closer to the score threshold for lower-accuracy bits, the initial score module 402 may allow the ECC decoder module 150 to roughly divide error correction into stages, so that errors in low-accuracy bits are largely corrected before errors in high-accuracy bits.

In one embodiment, having used the initial score module 402 to assign an initial score, the score module 304 may assign a subsequent score for a variable node based on a previous score and on a count of unsatisfied check nodes associated with the variable node. In a certain embodiment, the score module 304 may determine a subsequent score by applying a function or mapping from the previous score and the count of unsatisfied check nodes associated with the variable node, to the subsequent score. In a further embodiment, multiple functions and/or mappings may be available to the score module for calculating a subsequent score, as described below with regard to the function select module 410.

In one embodiment, a function or mapping may correlate the score for a variable node with a previous score for the variable node and a count of unsatisfied check nodes associated with the variable node. In a certain embodiment, if the previous score for a variable node is in the first sub-range described above (e.g., the score does not satisfy the score threshold), then the previous score indicates a previous estimate that the corresponding bit of the received code word is likely correct. Thus, unless a high count of unsatisfied check nodes associated with the variable node indicates that the previous estimate is in error, the score should remain in the first sub-range. In a further embodiment, if the previous score for a variable node is in the second sub-range described above (e.g., the score satisfies the score threshold), then the previous score indicates a previous estimate that the corresponding bit of the received code word is likely in error. Thus, unless a high count of unsatisfied check nodes associated with the variable node indicates that the previous estimate is in error, the score should remain in the second sub-range.

Although the score in either case should remain in the same sub-range if the count of unsatisfied check nodes associated with the variable node is low, the score should be moved in the direction of the score threshold, and possibly cross the score threshold into the other sub-range if the count of unsatisfied check nodes associated with the variable node is high. Accordingly, in some embodiments, a function or mapping for assigning the score may include moving the previous score in the direction of the score threshold by a distance corresponding to the number of unsatisfied check nodes associated with the variable node. In certain embodiments, "moving the previous score in the direction of the score threshold" may refer to increasing the score if the previous score is below the score threshold, or to decreasing a score if the previous score is above the score threshold, even if the score crosses the score threshold and is then moving away from it. For example, in one embodiment, if the first sub-range contains values less than the score threshold and the second sub-range contains values greater than or equal to the score threshold, then a function or mapping for assigning the score may include adding a step size corresponding to the number of unsatisfied check nodes associated with the variable node to a previous score below the score threshold, and may include subtracting a step size corresponding to the number of unsatisfied check nodes associated with the variable node from a previous score at or above the score threshold Additionally, in one embodiment, a function or mapping for assigning the score may include adjusting a result using one or more adjustment factors. In certain embodiments, an adjustment factor may be a positive number, a negative number, or zero, and adjusting a result may include adding an adjustment factor, subtracting an adjustment factor, scaling the result by an adjustment factor, or the like. In a further embodiment, adjusting a result may also include applying an additional operation, such as rounding or truncating a scaled value, or the like.

In some embodiments, adjusting the result for a mapping by an adjustment factor may tend to bias the scores for a variable node away from the score threshold, thus preventing the scores from repeatedly crossing the score threshold unless the count of unsatisfied check nodes associated with the variable node is repeatedly high. For example, in one embodiment, if the first sub-range contains values less than the score threshold and the second sub-range contains values greater than or equal to the score threshold, then a function or mapping for assigning the score may include subtracting a small adjustment factor from a previous score below the score threshold. In a further embodiment, the same function or mapping for assigning the score may include adding a small adjustment factor to a previous score at or above the score threshold. By using a function or mapping that biases scores away from the score threshold, the score module 304 may avoid updating too many variable nodes at once, and may avoid loops that occur when the scores for the variable nodes repeatedly overshoot the score threshold. Conversely, the adjustment factors may be selected for another function or mapping to allow the variable nodes to change more quickly.

In another embodiment, if the raw error rate for the non-volatile memory media 122 is below 50%, most bits of a received code word are likely correct, and so an adjustment factor for a function or mapping may bias the results toward the first sub-range of possible scores. In a further embodiment, one function or mapping may apply little to no bias, or may be biased toward the second range of possible scores (e.g., scores that satisfy the score threshold), and may quickly update variable nodes to produce a corrected code word if the received code word contains few errors. However, if the code word contains more errors (for example, if over 200 check nodes are unsatisfied for a 17,920 bit code word), then a very high count of unsatisfied check nodes associated with a variable node may actually indicate that the corresponding bit of the received code word is correct. Accordingly, in a certain embodiment, another function or mapping may apply a larger bias towards the first sub-range in subsequent iterations. Thus, in a certain embodiment, the adjustment factors for different functions are selected to apply different biases in different iterations.

In one embodiment, a function or mapping for assigning the score may bias the results towards the first sub-range, keeping more bit values for variable nodes un-flipped compared to the corresponding bits in the received code word, thus increasing the likelihood of converging to the correct answer for a code word with a high initial count of unsatisfied check nodes, even if the number of iterations increases. Conversely, in another embodiment, another function or mapping for assigning the score may bias the results towards the second sub-range, so that scores cross the score threshold more quickly and the LDPC code decoder uses fewer iterations to determine which bits are in error, but at an increased risk of the scores for the variable nodes not converging to an answer that satisfies the check nodes.

The functions and mappings heretofore described may, in various embodiments, be restricted or bounded to a range for the score. For example, in one embodiment, if the score may be in a range from zero to seven, a function or mapping may return a score of zero, instead of a negative score, and may return a score of seven instead of a score greater than seven. Restricting the score to a particular range allows the score module 304 to store or track the score using a small number of bits (e.g., three bits for scores from 0 to 7, or eight bits for scores from 0 to 255). In various embodiments, logic hardware for the functions or mappings may include various components. For example, in one embodiment, the score module 304 may include an ASIC, including adders and comparators for calculating a score. In another embodiment, the score module 304 may assign the score based on a pre-computed lookup table of an FPGA, that maps input values (e.g., previous scores and counts of unsatisfied check nodes) to output values (e.g., scores). In a further embodiment, an FPGA may include more than one lookup table, for more than one function or mapping. In various further embodiments, the functions or mappings may be implemented in various ways. A further example function for assigning a score is described below with regard to FIG. 5.

The score module 304, in one embodiment, may use the count scale module 404 to scale the count of unsatisfied check nodes used to calculate the score. In a certain embodiment, as described above, the score module 304 may calculate the score by adjusting a previous score in the direction of the score threshold by a distance corresponding to the number of unsatisfied check nodes associated with the variable node. In a further embodiment, the score module 304 may use the count scale module 404 to calculate the score by moving the previous score in the direction of the score threshold by a distance corresponding to a scaled count of unsatisfied check nodes associated with the variable node.

By scaling the count of unsatisfied check nodes associated with the variable node, the count scale module 404 may, in some embodiments, control how much a score may change in each iteration, so that the score take more or fewer iterations to cross the score threshold. In various embodiments, a scaled count may refer to the product, or approximate product, of a scale factor and the count of unsatisfied check nodes associated with the variable node. In various embodiments, a scale factor may be greater than 1.0 so that the score changes more quickly, less than 1.0 so that the score changes more slowly, or equal to 1.0, so that the count of unsatisfied check nodes associated with the variable node is effectively un-scaled. Alternatively, in some embodiments, the score module 304 may calculate the score without using the count scale module 404, rather than applying a scale factor of 1.0.

The scaled count, in some embodiments, may be an approximate product of the un-scaled count and the scale factor, rather than an exact product, for lower hardware complexity. For example, in one embodiment, if the count scale module 404 may scale the count by a scale factor of 1.5 by shifting the binary representation of the count one bit to the right (non-cyclically, discarding the right-most bit), and adding the shifted value to the original count. Because the right-most bit is discarded in the shift, the scaled count is an exact product of the un-scaled count and the scale factor if the un-scaled count is even, but is a truncated product of the un-scaled count and the scale factor if the un-scaled count is odd. However, scaling the count in this manner allows the count scale module 404 to roughly control how much the scores may change in each iteration by using low-complexity hardware complexity for integer arithmetic instead of by using more complex hardware for floating-point arithmetic.

In one embodiment, the count scale module 404 may scale the count using different scale factors depending on whether the previous score satisfies, or fails to satisfy the score threshold. In some embodiments, a first scale factor used by the count scale module 404 when previous scores fail to satisfy the score threshold may be greater than a second scale factor used by the count scale module 404 when previous scores satisfy the score threshold. For example, in a further embodiment, if the range of scores that fail to satisfy the score threshold (e.g., the first sub-range described above) is large (e.g., at or above 6-bit effective precision as described below), then the count scale module 404 may multiply the count of unsatisfied check nodes associated with the variable node by a scale factor of 1.5, if the previous score is in the first sub-range, so that scores traverse the first sub-range and cross the score threshold in fewer iterations, thus correcting bits more quickly. However, the count scale module 404 may also scale the count by a scale factor of 1.0 (or leave the count un-scaled) if the previous score is in the second sub-range, so that an estimation that a bit is incorrect is not quickly changed back to an estimation that the bit is correct.

The asymmetric range module 406, in one embodiment, is configured to position the score threshold within the range of possible values for the scores. In various embodiments, a means for positioning the score threshold may include an asymmetric range module 406, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for positioning the score threshold within the range of possible values for the scores.

In a further embodiment, the asymmetric range module 406 may position the score threshold within the range of possible values so that the score threshold divides the range of possible scores into a first sub-range of scores that do not satisfy the score threshold and a second subrange of scores that satisfy the score threshold. In certain embodiments, the first sub-range may be larger than the second sub-range. In various embodiments, the size of a range or sub-range may refer to the number of values in the range. Thus, the first sub-range may be referred to as "larger" than the second sub-range if the first sub-range includes more possible values for the score.

In some embodiments, the ECC decoder module 150 may not use an asymmetric range module 406 to divide the range of possible scores into larger and smaller sub-ranges. Instead, in certain embodiments, the first sub-range and the second sub-range may be the same size. Equal size sub-ranges may, in some embodiments, be convenient if the full size of the range is determined by the number of bits allocated for the score, because the score module 304 may determine if the score satisfies the score threshold by checking the most significant bit of the score. For example, in one embodiment, if the score is a six-bit value so that the range of possible values goes from 0 to 63, then the score threshold may be satisfied if the most significant bit of the score is a one (equivalently, if the score is greater than or equal to 32). Thus, the full range from 0 to 63 may be divided into a first sub-range from 0 to 31 and a second sub-range from 32-63, so that each sub-range includes 32 possible values.

In certain embodiments, however, using equal size sub-ranges may result in part of the range of possible values being unused. For example, in one embodiment, the score module 304 may assign a score to a variable node by moving a previous score in the direction of the score threshold by a distance based on the number of unsatisfied check nodes associated with the variable node. Thus, in certain embodiments, continuing the above example where the first sub-range is below the second sub-range, a score in the second sub-range may be reduced in subsequent iterations, and a score in the first sub-range may be increased in subsequent iterations. Accordingly, in some embodiments, if the score module 304 does not apply an adjustment factor to keep high scores high, the maximum score may be the maximum in the first sub-range, plus the maximum step size based on the count of unsatisfied check nodes. In one embodiment, if the column weight of the parity check matrix is 4, then the maximum number of unsatisfied check nodes for the variable node would also be 4. In a further embodiment, even if the score module 304 uses the count scale module 404 to scale the count of unsatisfied check nodes by 1.5 for scores in the first sub-range, the maximum step size between a score and a previous score would be 6. Continuing the six-bit score example from the previous paragraph, in a further embodiment, the maximum score within the range from 0 to 63 would be 31 (the maximum score in the first sub-range) plus 6 (the maximum step size), or 37. In various embodiments, the rest of the available range from 38 to 63 would be unused.

In some embodiments, however, the asymmetric range module 406 may position the score threshold so that the first sub-range is larger than the second sub-range. Positioning the score threshold so that the first sub-range is larger than the second sub-range allows the asymmetric range module 406 to use otherwise unused parts of the second sub-range to expand the first sub-range, without allocating additional bits to track the score.

In various embodiments, because scores satisfying the score threshold indicate that the value of the variable node should be flipped relative to the corresponding bit, the initial scores may be in the first sub-range (e.g., the sub-range for scores that do not satisfy the score threshold), so that the variable nodes are initially un-flipped. As described above, in certain embodiments, the score module 304 may use the initial score module 404 to determine initial scores for the variable nodes based on the soft information or another indication of accuracy, and may assign initial scores closer to the score threshold for lower-accuracy bits, so that lower-accuracy bits are likely to be corrected first.

Thus, in further embodiments, the size of the first sub-range may correspond to a distance between possible initial scores that indicate different estimated probabilities that the bit is in error, based on the soft information or another indication of accuracy. In various embodiments, the size of the first sub-range may "correspond" to a distance between possible initial scores if it is in some way based on the distance between possible initial scores. For example, in one embodiment, the size of the first sub-range may equal the distance between possible initial scores if different initial scores for high-accuracy bits and low-accuracy bits are at the endpoints of the first sub-range. In another embodiment the size of the first sub-range may approximately equal the distance between possible initial scores if different initial scores for high-accuracy bits and low-accuracy bits are near the endpoints of the first sub-range. In a further embodiment, the size of the first sub-range may be approximately double the distance between possible initial scores for high-accuracy and intermediate-accuracy bits. However, in all the above cases, the size of the first sub-range may be said to correspond to a distance between possible initial scores. In light of this disclosure, many possible sizes of for the first sub-range are clear that may correspond to a distance between possible initial scores, in various embodiments.

In some embodiments, increasing the distance, or difference between possible initial scores may increase the likelihood that the ECC decoder module 150 will correct lower-accuracy bits with variable node scores close to the score threshold before attempting to correct higher-accuracy bits with variable node scores further from the score threshold. Thus, by positioning the score threshold so that the first sub-range is larger than the second sub-range, the asymmetric range module 406 may increase error correction performance by using otherwise unused parts of the second sub-range to increase the possible distance between initial scores.

For example, in one embodiment, continuing the six-bit score example, if the first and second sub-ranges are the same size, then the greatest distance between possible initial scores in the first sub-range is 31, but, as described above, the maximum possible score may be 37. In a further embodiment, the asymmetric score module 406 may increase the possible distance between initial scores, by setting the score threshold so that scores greater than or equal to 58 satisfy the score threshold, and initial scores in the first sub-range may be between 0, for high-accuracy bits, and 57, for low-accuracy bits. In a further embodiment, the maximum possible score would be 63 (57+the maximum step size of 6, as described above), and the score module 304 would be able to utilize the full range of scores.

In another embodiment, the asymmetric score module 406 may position the score threshold so that the first sub-range is larger than the second sub-range, but also for convenience in determining whether scores satisfy the score threshold. For example, in one embodiment, the asymmetric score module 406 may set the score threshold for a six-bit score so that scores greater than or equal to 56 satisfy the score threshold, thus allowing the score module 304 to determine whether a score satisfies the score threshold by checking the three most significant bits of the score.

In one embodiment, the asymmetric range module 406 may position the score threshold within the range of possible values for the scores by selecting or setting a score threshold within a fixed range of possible scores. In another embodiment, however, the asymmetric range module 406 may position the score threshold within the range of possible scores by selecting one or both endpoints for a range of possible scores, so that the score module 304 restricts scores within the selected range. In a further embodiment, the asymmetric range module 406 may determine both the score threshold and one or more endpoints for the range. Many ways to position the score threshold within the range of possible scores are clear in light of this disclosure.

The precision selection module 408, in one embodiment, is configured to select a bit width, precision, or range of possible values for the score. In some embodiments, the score module 304 may cooperate with the precision selection module 408 to select a range of possible values for the score. In various embodiments, a means for determining a precision for the score may include a precision selection module 408, a score module 304, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for determining a precision for the score. In various embodiments, the precision selection module 408 may select the range of possible score values based on an estimated number of errors for the received code word, a desired level of error correction capability, and/or an initial count of unsatisfied check nodes.

As described above with regard to the asymmetric score module 406, increasing the possible distance between initial scores may increase error correction capability by making the ECC decoder module 150 more likely to correct lower-accuracy bits before attempting to correct errors in higher-accuracy bits. Thus, by selecting a range of possible values for the score, the precision selection module 408 may increase or decrease error correction capability. For example, in one embodiment, the precision selection module 408 may increase error correction capability by selecting a large range of possible values for the score. In another embodiment, the precision selection module 408 may decrease error correction capability by selecting a smaller range of possible values for the score. Decreasing error correction capability may increase the speed of error correction in some embodiments, and may still effectively correct errors in applications where few errors are expected. Thus, using a precision selection module 408 to select a precision, bit width, or range of possible values for the score may provide a lower gate count and/or a higher speed for lower-precision scores, or may provide a higher error correction capability (with a tradeoff of slower decoding) for higher-precision scores.

In one embodiment, the precision selection module 408 may select a range of possible values for the scores by determining how many bits the score module 304 may use to store and track the scores. For example, in one embodiment, the precision selection module 408 may allocate 3 bits for the score, so that the score is within a range from 0 to 7. In another embodiment, the precision selection module 408 may allocate 8 bits for the score, so that the score is within a range from 0 to 255. Because increasing the allocation of bits for the score increases error correction capability by enlarging the range of possible scores, the number of bits that the precision selection module 408 allocates for the score may be referred to herein as the "precision" of the score. In various embodiments, higher-precision scores may provide improved error correction capabilities due to the increased distance between initial scores for different bit accuracies.

In some embodiments, the precision selection module 408 may cooperate with the asymmetric range module 406 to select an effective precision for the score by determining both the range of possible values and the position of the score threshold within the range. In various embodiments, if the score threshold divides the range of possible scores into a first sub-range of values that do not satisfy the score threshold and a second sub-range of values that satisfy the score threshold, then the "effective precision" may be based on the number of possible scores in the first sub-range, because the size of the first sub-range corresponds to the distance between possible initial scores. For example, the actual precision may be the logarithm, base two, of the number of possible scores in the full range, and the effective precision may be the logarithm, base two, of the number of possible scores in the first sub-range, plus one (so that the effective precision matches the actual precision when the first sub-range is half the size of the full range). As used herein, the term "precision" may refer to either an actual precision or an effective precision.

For example, in one embodiment, the precision selection module 408 may select a 7-bit precision for the score, so that the range of possible scores runs from 0 to 127. Without using the asymmetric range module 408, the score module 304 may set the score threshold so that scores greater than or equal to 64 satisfy the score threshold, and the effective precision is also 7 bits. In a further embodiment, the asymmetric range module 408 may set the score threshold so that scores greater than or equal to 120 satisfy the score threshold, and the effective precision is 7.9 bits.

In various embodiments, precision selection module 408 may cooperate with the asymmetric range module 406 to select an effective precision for the score by selecting a range of possible scores and positioning the score threshold within the range in various ways. For example, in one embodiment, the number of bits for storing the score may be fixed in hardware of the ECC decoder module 150, but the precision selection module 408 may select one or both endpoints of a range that the score module 304 will restrict scores within. Similarly, in a further embodiment, the score threshold may be fixed in hardware to avoid providing additional hardware for comparing scores to different score thresholds, but the precision selection module 408 may cooperate with the asymmetric range module 406 to select endpoints for the range that are different distances above and below the score threshold. In view of this disclosure, many ways of selecting a range of possible scores and positioning the score threshold within the range are clear.

In one embodiment, the precision selection module 408 may select the range of possible values for the score based on a desired level of error correction capability. A desired level of error correction capability may be predetermined by a vendor or manufacturer, selected at setup time or runtime by a user or administrator, dynamically determined by the precision selection module 408, or the like. For example, in a further embodiment, the precision selection module 408 may increase or decrease the precision (or effective precision) of the score to increase or decrease the level of error correction capability. In general, increasing the precision may increase the level of error correction capability, but may also decrease throughput for an LDPC code decoder. Thus, in one embodiment, if many errors are expected, the precision selection module 208 may select a high precision for the score to correct multiple errors. In another embodiment, however, if fewer errors are expected, the precision selection module 208 may select a lower precision for the score to provide adequate error correction capability at higher speeds.

The precision selection module 408, in certain embodiments, may determine a desired level of error-correction capability based on a characteristic of a non-volatile memory device 120, a non-volatile memory element 123, the non-volatile memory media 122, or the like from which a code word is read. For example, in various embodiments, the precision selection module 408 may determine a desired level of error-correction capability based on an age (e.g., a program/erase count, an amount of time powered on, an amount of time since first used, an amount of time since manufacture), an error rate (e.g., a raw bit error rate (RBER), an uncorrectable bit error rate (UBER), or the like), a failure of a storage element (e.g., a non-volatile memory element 123, a chip, a die, a die plane), a retirement of a storage element, a re-use of a previously retired storage element, or another characteristic of a non-volatile memory device 120, a non-volatile memory element 123, the non-volatile memory media 122, or the like. For example, in one embodiment, the precision selection module 408 may select a higher desired level of error-correction capability as the non-volatile memory device 120, a non-volatile memory element 123, the non-volatile memory media 122, or the like ages, as an error rate increases, as one or more storage elements fail, as one or more storage elements are retired, as a retired storage element is selected for re-use, or the like.

In one embodiment, the precision selection module 408 may select the range of possible values for the score based on an initial count of unsatisfied check nodes for the code word. In certain embodiments, an initial count of unsatisfied check nodes for the code word may provide an estimated number of errors for the code word. As used herein, an estimated number of errors for a code word or other set of data may comprise an actual or predicted amount of errors for the set of data. In certain embodiments, an estimated number of errors for a code word may be represented by a numerical value (e.g., 4 bits in error, 7 bits in error, 10 bits in error, 19 bits in error, or the like). In another embodiment, an estimated number of errors for a code word may be represented by a relative identifier (e.g., low, medium high; weak, intermediate, strong; good, bad; or the like).

In one embodiment, the precision selection module 408 may predict an estimated number of errors for a code word which may or may not be accurate, based on a count of unsatisfied check nodes for the code word; based on a characteristic of a non-volatile memory device 120, a non-volatile memory element 123, the non-volatile memory media 122, or the like from which a code word is read, such as an age (e.g., a program/erase count, an amount of time powered on, an amount of time since first used, an amount of time since manufacture), an error rate (e.g., a raw bit error rate (RBER), an uncorrectable bit error rate (UBER), or the like), a failure of a storage element (e.g., a non-volatile memory element 123, a chip, a die, a die plane), a retirement of a storage element, a re-use of a previously retired storage element, or another characteristic of a non-volatile memory device 120, a non-volatile memory element 123, the non-volatile memory media 122, or the like from which the code word is read; based on a statistical simulation or model; and/or based on other information. For example, the precision selection module 408 may determine an approximate or expected number of errors based on one or more of the factors described above, which may or may not equal an actual number of errors.

In a further embodiment, the estimated number of errors for a code word determined by the precision selection module 408 may comprise an actual number of errors for the code word. For example, in certain embodiments, the ECC decoder module 150 may be configured to determine an actual number of errors for a code word without and/or prior to correcting the errors, allowing the precision selection module 408 to determine a range of possible values for a score, whether or not to obtain soft information or another indication of accuracy, or the like for the code word.

In various embodiments, a means for determining an estimated number of errors based on an initial count of unsatisfied check nodes may include a precision selection module 408, a score module 304, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for determining an estimated number of errors. For example, a received code word with more unsatisfied check nodes likely include more errors than a received code word with fewer unsatisfied check nodes. In a further embodiment, statistical simulations of large numbers of code words with random errors may provide an accurate model of the relationship between the initial count of unsatisfied check nodes for the code word and the number of errors. Further modeling may provide accurate information about how many errors the LDPC code decoder can likely correct with scores of different precisions (or effective precisions), or with different amounts of soft information or other indications of accuracy. Thus, in one embodiment, the precision selection module 408 may select the range of possible scores to correct a likely number of errors for the initial count of unsatisfied check nodes. In a different embodiment, the soft information module 302 may similarly request, read, obtain, or receive additional soft information or another indication of accuracy to improve the level of error correction capability based on the initial count of unsatisfied check nodes for the code word.

In another embodiment, the function select module 410 may similarly be configured to select a function or mapping based on the initial count of unsatisfied check nodes for the code word. In a further embodiment, the score module 304 may assign a score to a variable node by using the function or mapping selected by the function select module 410 to determine the score based on the variable node's previous score and count of unsatisfied check nodes. In a certain embodiment, the score module 304 may use one function or mapping for assigning the score in each iteration, until the iteration limit is reached, in which case the score module 304 may reset the count of iterations and use another function or mapping for assigning the score in subsequent iterations.

The control loop module 412, in one embodiment, is configured to stop the iterations of the score module 304 and check node update module 306, in response to determining that an iteration termination condition is satisfied. In certain embodiments, satisfying the iteration termination condition may include reaching an iteration limit and/or determining that the plurality of check nodes are satisfied. In one embodiment, the ECC decoder module 150 iteratively revises the score for a data value or variable node (by assigning an updated score), and updates or toggles the check nodes associated with the variable node in response to the updated score crossing the score threshold, until the control loop module 412 determines that the plurality of check nodes is satisfied (e.g., the relationships between data values described by the parity check matrix are satisfied). In a further embodiment, if the plurality of check nodes is satisfied, then the value of each check node is zero, and the bit values of the variable nodes have been corrected to form a valid code word for the LDPC code. Applying a matrix multiplication to the corrected code word reverses the encoding to recover the original, unencoded message. Thus, in a certain embodiment, if the control loop module 412 determines that the check nodes are satisfied, then decoding the LDPC code using scored variable nodes has been successful.

In another embodiment the ECC decoder module 150 iteratively assigns an updated score to a variable node, and updates one or more of the check nodes based on the updated score, until the control loop module 412 determines that the ECC decoder module 150 has reached an iteration limit. An iteration limit, in various embodiments, may include a condition for ending the iterations of the ECC decoder module 150 without fully correcting the code word. For example, in one embodiment, an iteration limit may indicate a maximum number of iterations for the ECC decoder module 150. In a further embodiment, the control loop module 412 determining that the check nodes are not satisfied but that the ECC decoder module 150 has reached the iteration limit, or the maximum number of iterations, may indicate that the iterations of the score module 304 and check node update module 306 have not fully corrected the code word.

In a certain embodiment, reaching the iteration limit may also indicate that the received code word is not likely to be correctable by continuing with further iterations. For example, in one embodiment, if the score module 304 is biased towards scores that satisfy the score threshold, the scores for a large number of variable nodes may change to satisfy the score threshold in each iteration. In some embodiments, changing a large number of scores to satisfy the score threshold in one iteration may result in faster error correction performance. However, in certain embodiments, changing a large number of scores per iteration may result in repeatedly overshooting the correct code word, so that further iterations are unlikely to correct the code word. However, even if the code word is not likely to be correctable by continuing with further iterations, the code word may be correctable in another way, as described below with regard to the iteration limit module 416. Alternatively, if the code word is uncorrectable, the ECC decoder module 150 may return an uncorrected or partially corrected code word or message.

The return module 414, in one embodiment, is configured to correct and/or decode a code word in response to the check node update module 306 determining that the plurality of check nodes are satisfied. As used herein, "correcting" a code word may comprise determining correct values for one or more bits in error and/or changing (e.g., flipping, toggling, or otherwise updating) the data values for the one or more bits in error. For example, as described above, in certain embodiments, the score module 304 and the check node update module 306 may correct errors in a received code word by iteratively determining scores and updating, changing bit values for, check nodes until the check nodes are satisfied. With the plurality of check nodes satisfied, scores that satisfy the score threshold indicate that flipping the corresponding bits of the received code word will produce a valid code word. Thus, in one embodiment, a bit of the corrected code word corresponding to a variable node is flipped, relative to the corresponding bit of the received code word, in response to the variable node's score satisfying the score threshold, or un-flipped in response to the variable node's score failing to satisfy the score threshold. The return module 414, in certain embodiments, may correct the code word (e.g., in a volatile memory buffer or another storage location) by generating a corrected code word based on the scores, and may decode the corrected code word, or the like. In one embodiment, decoding the code word may include applying a matrix multiplication to the code word that reverses the effect of the generator matrix, to recover the original message. In a further embodiment, the return module 414 may return the decoded message of a corrected code word to a client 116. In another embodiment, the return module 414 may correct and/or decode a code word as part of a garbage collection or grooming process, to validate data before it is re-encoded and stored in a different location for the non-volatile memory media 122.

The iteration limit module 416, in one embodiment, may be configured to take additional steps in response to reaching the iteration limit. For example, in one embodiment, the iteration limit module 416 may make a random adjustment to one or more of the scores in response to reaching the iteration limit. In a further embodiment, the iteration limit module 416 may reset the iteration count below the iteration limit, so that the score module 304 and the check node update module 306 continue to update scores based on the randomly adjusted scores, and toggle check nodes based on scores crossing the score threshold, until the iteration limit is reached again. In certain embodiments, randomly adjusting one or more scores may get the ECC decoder module 150 out of a loop that does not otherwise converge.

In various embodiments, the iteration limit module 416 may handle reaching the iteration limit in different ways. For example, in one embodiment, the iteration limit module 416 may cooperate with the precision selection module 408 to increase the precision if the iteration limit is reached with a lower-precision score. In another embodiment, the iteration limit module 416 may engage a software ECC decoder with a higher error correction capability and a lower speed to decode the received code word, if the ECC decoder module 150 reaches the iteration limit. In a certain embodiment, the iteration limit module 416 may generate multiple additional code words by flipping different bits of the originally received code word, and may restart LDPC code decoder to attempt to decode each of the additional code words. In a further embodiment, although many of the additional code words would have one more error than the originally received code word, one of the additional code words would have one fewer error than the originally received code word, and might be successfully decoded. In another embodiment, the iteration limit module 416 may return an uncorrected or partially corrected code word, or may just return an error. In view of this disclosure, many ways of using an iteration limit module 416 to handle reaching the iteration limit are clear.

In a further embodiment, the iteration limit module 416, may be configured to create an updated or partially corrected code word based on flipping bits of the received code word in response to the score for corresponding variable nodes satisfying the score threshold, and to restart the LDPC code decoder with the updated code word. In one embodiment, the iteration limit module 416 may create an updated code word by reading values stored or tracked by the updated variable nodes, which are toggled in response to the score crossing the score threshold. For example, if the iteration limit has been reached, the iteration limit module 416 may obtain a partially corrected code word from the updated variable nodes. In one embodiment, restarting the LDPC code decoder may include restarting the process of the LDPC code decoder assigning scores and updating check nodes. The iteration limit module 416 may restart the process by causing the score module 304 to reassign scores to variable nodes, so that the scores are based on a count of unsatisfied check nodes associated with each variable node, without regard to a previous score. Thus, by restarting the LDPC code decoder with the plurality of variable nodes corresponding to the updated, or partially corrected code word, the iteration limit module 416 causes the score module 304 to reinitialize the variable node scores, which may break the LDPC code decoder out of a loop and allow the ECC decoder module 150 to fully correct the code word before the iteration limit is reached a second time. In a further embodiment, the iteration limit module 416 may use one or more additional bits per variable node to create and store the updated code word.

In a certain embodiment, as discussed above with regard to the function select module 410, the score module 304 may select one of at least two functions or mappings available for assigning the score. In a further embodiment, the iteration limit may be reached in iterations where the score module 304 assigns the score using a first function or mapping. In a certain embodiment, the score module 304 may select a second function or mapping for assigning the score in response to the iteration limit module 416 restarting the LDPC code decoder with the plurality of variable nodes corresponding to the updated, or partially corrected code word. In some embodiments, restarting the LDPC controller with an updated code word and a different function or mapping for assigning the score may break the LDPC code decoder out of a loop and allow the ECC decoder module 150 to fully correct the code word before the iteration limit is reached a second time.

The code word interleave module 418, in one embodiment, is configured to interleave decoding for at least two code words by assigning a score to a variable node for a first code word while updating one or more check nodes for a second code word. In a certain embodiment, the code word interleave module 418 may cause the score module 304 to assign a score to a variable node of a first code word by calculating the score based on a function, or mapping of a previous score for each variable node and the count of unsatisfied check nodes for each variable node. In some embodiments, the score module 304 may use logic hardware such as adders or XOR gates to calculate the score. In a further embodiment, where the parity check matrix for the LDPC code decoder comprises a matrix of cyclically shifted identity matrices and zero matrices, the code word interleave module 418 may cause the check node update module 306 to update the check nodes by cyclically shifting a group of N variable nodes by an amount corresponding to a different cyclically shifted identity matrix for each group of N check nodes, or by taking no action to apply a zero matrix to a group of N variable nodes. The code word interleave module 418 may use logic hardware of the LDPC code decoder efficiently by using barrel shifters, or the like, to update check nodes by cyclically shifting the variable nodes for one code word, while using adders, or the like, to assign scores to variable nodes of another code word. By interleaving decoding for at least two code words, the code word interleave module 418 may increase the speed and/or throughput of the LDPC code decoder. For example, one iteration for a first code word may begin by calculating scores for the first code word, while another iteration for a second code word finishes by revising check nodes for the second code word. The iteration for the first code word may then finish by revising check nodes for the first code word while a new iteration for the second code word begins calculating scores for the second code word. Handling iterations of different code words simultaneously, or in parallel in certain embodiments, provides increased throughput for a given set of hardware. In another embodiment, the ECC decoder module 150 may further increase throughput by decoding more than two code words simultaneously, interleaving two code words for each of several parallel LDPC code decoders.

Figure 5:
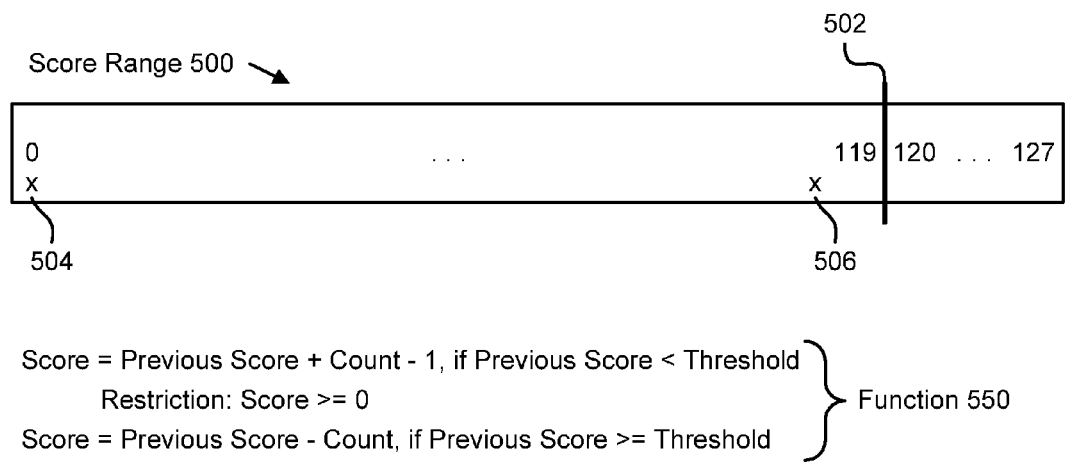
FIG. 5 is a schematic block diagram illustrating one embodiment of a range of possible score values.

FIG. 5 depicts one embodiment of a range 500 of possible score values. In the depicted embodiment, the range 500 is a 7-bit range extending from zero to 127. In another embodiment, however, the range 500 may have a different bit width, or different end points. A score threshold 502 divides the score range into two sub-ranges. In the depicted embodiment, higher scores indicate a higher probability that a bit is in error, so the first sub-range of scores that fail to satisfy the score threshold 502 is below the score threshold 502, and the second sub-range of scores that satisfy the score threshold 502 is above the score threshold 502. In another embodiment, however, the relationship between a score and a probability that a bit is in error may be different; for example, a lower score could indicate a higher probability that a bit is in error.

In the depicted embodiment, the score threshold 502 is positioned asymmetrically within the range 500 so that scores from 0 to 119 are in the first sub-range, and scores from 120 to 127 are in the second sub-range. The size of the first sub-range, from 0 to 119, corresponds to the distance between possible initial scores 504, 506. In the depicted embodiment, the initial score 504 for high-accuracy bits is 0, and the initial score 506 for low-accuracy bits is closer to the score threshold at approximately 117. In one embodiment, the large spacing between the initial scores 504, 506 increases error correction capability by increasing the likelihood that the score for low-accuracy bits will cross the score threshold first. In another embodiment, the precision selection module 408 may reduce the effective precision restricting the range 500 so that the first end point and the initial score 504 for high-accuracy bits are higher.

A function 550 is also depicted for determining a score for a variable node based on a previous score and a count of unsatisfied check nodes associated with the variable node. In the depicted embodiment, the function 550 includes moving a previous score in the direction of the score threshold 502 by a distance corresponding to a count of unsatisfied check nodes for a variable node. Thus, when the previous score is below the score threshold 502, the function 550 includes adding the count of unsatisfied check nodes to the previous score. Similarly, when the previous score is above the score threshold 502, the function 550 includes subtracting the count of unsatisfied check nodes from the previous score. In the depicted embodiment, the count of unsatisfied check nodes is unscaled. In another embodiment, however, the count of unsatisfied check nodes may be scaled by different scale factors depending on whether the previous score is above or below the score threshold 502. For example, in one embodiment, the count of unsatisfied check nodes may be unscaled (or scaled by a factor of 1.0) when the previous score is above the score threshold 502, and may be scaled by a factor of 1.5 when the previous score is below the score threshold 502.

In the depicted embodiment, the function 550 also includes applying an adjustment factor by subtracting 1 if the previous score is below the score threshold 502. Subtracting 1 from scores below the score threshold 502 may prevent scores from crossing the score threshold 500 too quickly if the count of unsatisfied check nodes is low. In the depicted embodiment, the function 550 also includes restricting the score to be greater than or equal to zero, so that subtracting 1 in repeated iterations does not take the score outside the range 500.

Figure 6:
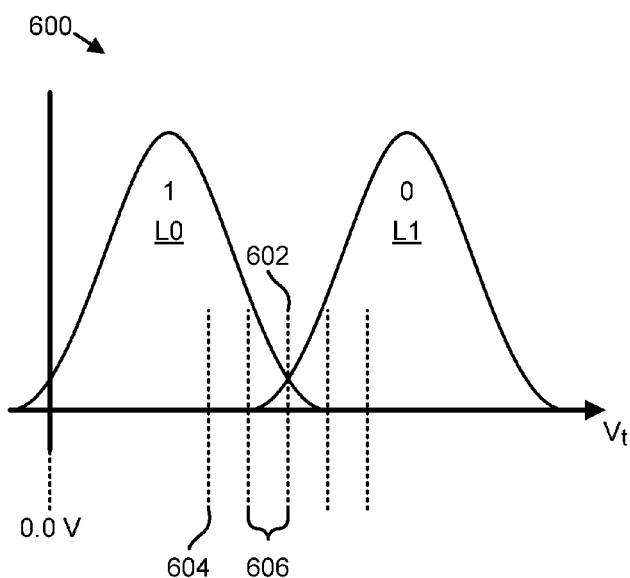
FIG. 6 is a graph illustrating one embodiment of a distribution of stored read voltage values for cells of a non-volatile memory medium.

FIG. 6 depicts a graph 600 of a distribution of stored read voltage values for cells of a non-volatile memory medium 122. In one embodiment, the soft information module 302 may receive the soft information or another indication of accuracy from a cell of a non-volatile storage medium 122 using a plurality of read thresholds. As used herein, a "cell" refers to the smallest physical unit of storage or memory in a non-volatile memory medium 122. In some embodiments, each cell has a physical and/or electrical property which may be altered to encode or otherwise store data. For example, in flash memory, a cell may include a floating gate transistor, and the physical property used to encode data may be the charge stored on the floating gate, a stored read voltage level caused by the charge stored on the floating gate, the threshold voltage $V_t$ that is sufficient to make the transistor conduct when applied to the control gate, or the like. As another example, in phase change memory, a cell may be a region of chalcogenide glass, and the physical property used to encode data may be the degree of crystallization of the region, the electrical resistance of the cell, or the like. As described above with regard to non-volatile memory media 122, many types of cells may store data of a non-volatile memory device 120 for use with the ECC decoder module 150

In the depicted embodiment, the non-volatile memory medium 122 is an SLC flash memory medium in which each cell has two states, but various types of memory and numbers of states per cell may be used in other embodiments. In the depicted embodiment, the data-encoding physical value of each cell is the stored read voltage of the cell. Data is stored in each cell by changing the amount of stored charge in the floating gate, which determines the stored read voltage for the cell and within which abode or state (e.g., the depicted L0, and L1 abodes) the stored read voltage falls.

In the depicted embodiment, a hard read threshold 602 divides the range of possible stored read voltage values for a cell into states L0 and L1, where L0 is the erased state. A hard read threshold voltage 602 is applied to the control gate of the cell, and if the applied hard read threshold voltage 602 is sufficient to make the channel of the floating gate transistor conductive, the stored read voltage for the cell is above the applied hard read threshold voltage 602. If the stored read voltage for a cell is below the hard read threshold 602, the cell is in the L0 state. If the stored read voltage for a cell is above the hard read threshold 602, the cell is in the L1 state. In some embodiments, the erased state L0 may correspond to a negative stored read voltage.

In one embodiment, an encoding maps states onto data values. For example, in the depicted embodiment, an encoding maps the two states L0 and L1 to the data values "1" and "0," respectively, so that the cell stores one bit of information. Cells of non-volatile memory media may store data using many other numbers of states per cell, with many other possible encodings.

The graph 600 depicts the distribution of stored read voltage values for a set of cells, representing the number of cells storing each possible stored read voltage value occurring for the set of cells, a random selection from the set of cells, or the like. The graph 600 depicts a uniform distribution between states L0 and L1. In practice, the distribution of states for a set of cells may not be uniform. For example, if a long string of zeroes is written to a set of cells, more cells may be in the L1 state, which encodes "0" than in the L0 state. However, data compression or whitening algorithms may make the distribution of states substantially uniform over a large set of cells.

Although the distribution may be substantially uniform between states L0 and L1, it is depicted as forming a bell-shaped peak in each state. In some embodiments, a cell may be programmed by issuing voltage pulses that move a stored read voltage level for the cell to or near a target voltage in the middle of the range of voltages that defines the state. Thus, a bell-shaped peak may be centered on the target programming voltage, or the like. The width of the peaks may be affected by variations in the cells and the programming process, or by error-causing phenomena such as read disturbs, program disturbs, stress-induced leakage current, or the like. Although symmetric, bell-shaped peaks are shown, skewed distributions and other distributions are possible. Over time, the distributions may widen or skew as the stored read voltage of cells move from their originally programmed values.

In the depicted embodiment, the peaks significantly overlap the boundaries between states, indicating that some cells may have moved into adjacent states. (The distribution is depicted as a set of overlapping peaks to emphasize the possibility that a cell may move into an adjacent state; an actual distribution may be the sum of the individual peaks). In various embodiments, the peaks may have widened from previously non-overlapping peaks due to an increased program/erase cycle count, increased retention time, or other characteristics of the set of cells that may cause the stored read voltage values to move. Therefore, the hard read threshold 602 may be insufficient to determine what data value was originally written to a cell, based on the cell's current state. Accordingly, in the depicted embodiment, soft read thresholds 604 (indicated by all dotted lines except for the hard read threshold 602) divide the range of possible stored read voltage values into bins 606 that are smaller than the states L0 and L1. The soft read thresholds 604 include four read thresholds near the hard read threshold 602. Although five soft read thresholds 604 are depicted with uniform spacing at the boundary between states, other different numbers of soft read thresholds 604 and spacing for soft read thresholds 604 may be used in other embodiments, depending on the desired soft read information or other indication of accuracy, such as two soft read thresholds 604, three soft read thresholds 604, four soft read thresholds 604, ten soft read thresholds 604, or another predetermined number of soft read thresholds 604.

Bins 606 defined by the soft read thresholds 604 have a finer granularity than the states or abodes, because of the increased number of soft read thresholds 604. The width of various bins 606, however, may vary as shown by the graph 600 due to varying distances between soft read thresholds 604. For example, in the depicted embodiment, the soft read thresholds 604 are closely spaced near the boundary between the states, but do not extend where the peaks do not significantly overlap, so bins 606 may be smaller where the peaks meet, but larger beyond the furthest soft read thresholds 604 from the boundary between states. This spacing of bins 606 may be useful, in some embodiments, because likelihoods of error may vary significantly between bins 606 at or near the overlap between peaks, but may be small for any bins 606 further away from the overlap.

In one embodiment, the soft information module 302 may receive the soft information or another indication of accuracy from a cell of a non-volatile storage medium 122 using a plurality of read thresholds. In one embodiment, the soft information or another indication of accuracy may include one bit of hard information based on the hard read threshold 602, and an additional bit of soft information or another indication of accuracy based on each soft read threshold 604 within the state L0 or L1 indicated by the hard information. For example, in the depicted embodiment, the soft information may include 1 bit of hard information indicating whether the cell is in the L0 or L1 state, and two bits of additional soft information based on the two soft read thresholds 604 within the indicated state. In one embodiment, the soft information module 302 may obtain the soft information by issuing a soft read command which applies multiple read thresholds. In another embodiment, the soft information module 302 may obtain the soft information by successively applying multiple read commands using one read threshold at a time, at different read voltages.

Figure 7:
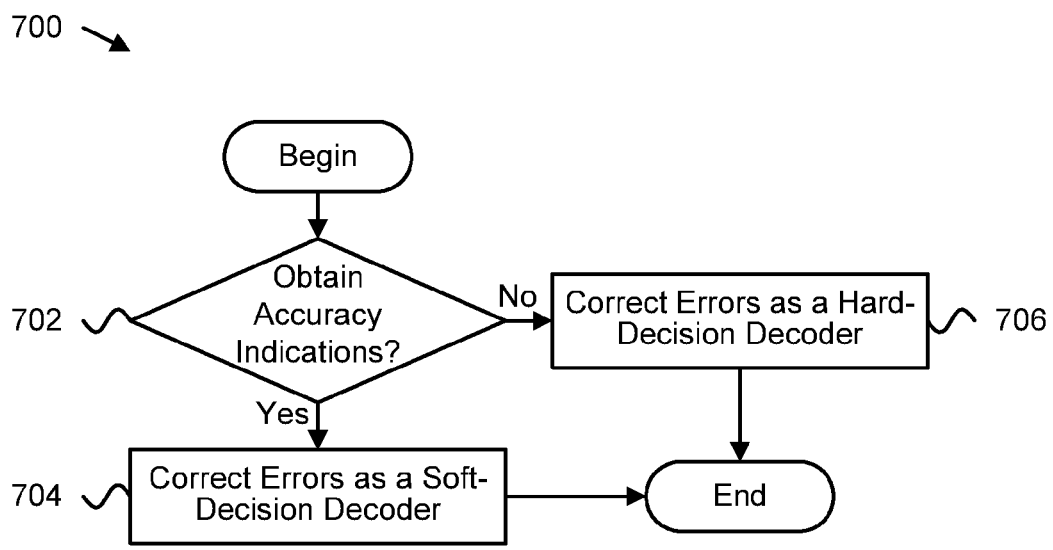
FIG. 7 is a schematic flow chart diagram illustrating one embodiment of a method for ECC decoding.

FIG. 7 depicts one embodiment of a method 700 for ECC decoding. The method 700 begins, and the soft information module 302 determines 702 whether to obtain indications of the accuracy of data values for variable nodes of an LDPC code decoder. In one embodiment, the soft information module 302 may determine 702 whether to obtain the accuracy indications based on an estimated number of errors for a received code word. If the soft information module 302 determines 702 to obtain the accuracy indications, the ECC decoder module 150 corrects 704 one or more errors in the received code word as a soft-decision decoder (e.g., using the accuracy indications), and the method 700 ends. If the soft information module 302 determines 702 not to obtain the accuracy indications, the ECC decoder module 150 corrects 706 one or more errors in the received code word as a hard-decision decoder (e.g., without using the accuracy indications), and the method 700 ends.

Figure 8:
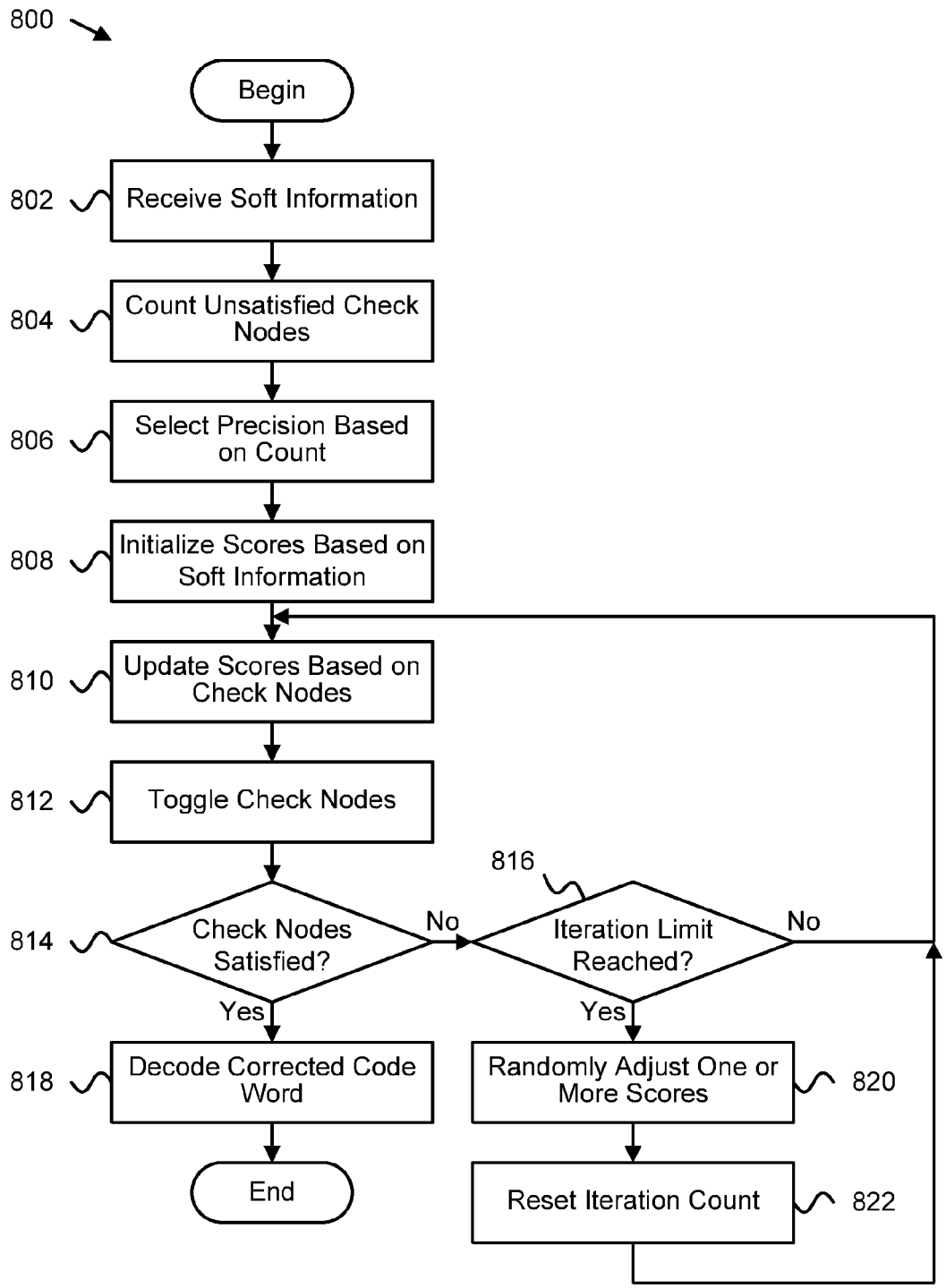
FIG. 8 is a schematic flow chart diagram illustrating a further embodiment of a method for ECC decoding.

FIG. 8 depicts another embodiment of a method 800 for ECC decoding. The method 800 begins, and the soft information module 302 receives 802 soft information or another indication of accuracy for variable nodes of an LDPC code decoder. In one embodiment, the soft information for a variable node may indicate a reliability or accuracy for a corresponding bit of a received code word. The precision selection module 408 counts 804 the initially unsatisfied check nodes for the code word, and selects 806 a precision for the score based on the count of unsatisfied check nodes. The initial count module 402 initializes 808 scores for the variable nodes based on the soft information. An iteration of the ECC decoder module 150 begins, and the score module 304 updates 810 scores for the variable nodes based on counts of unsatisfied check nodes of the LDPC code decoder that are associated with the variable nodes. The check node update module 306 toggles 812 check nodes associated with a variable node in response to the score for the variable node crossing a score threshold.

The control loop module 412 determines 814 whether the check nodes are satisfied. If the check nodes are not satisfied, the control loop module 412 determines 816 whether the ECC module 150 has reached an iteration limit. If the iteration limit is not reached, the control loop module 412 begins a new iteration of the ECC decoder module 150, the score module 304 updates 810 the scores, and the method 800 continues. If the iteration limit is reached, the iteration limit module 416 randomly adjusts 820 one or more of the scores and resets 822 the iteration count below the iteration limit. The control loop module 412 begins a new iteration of the ECC decoder module 150, the score module 304 updates 810 the scores, and the method 800 continues. If the check nodes are satisfied, then the return module 414 decodes 818 a corrected code word based on the updated scores, to obtain the original, unencoded message, and the method 800 ends.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
    determining, based on an estimated number of errors for a code word received by an error correcting code (ECC) decoder, whether to obtain an indication of accuracy for data values of the received code word; and
    correcting one or more errors in the received code word based on the accuracy indication using the ECC decoder, in response to determining to obtain the accuracy indication, by assigning scores to the data values based on the accuracy indication, the score for a data value indicating a probability that the data value is in error, and updating the scores based on relationships between the data values, the relationships described by a parity check matrix.

2. The method of claim 1, wherein a score threshold divides a range of possible values for the scores into a first range of values indicating a lower probability that a data value is in error and a second range of values indicating a higher probability that a data value is in error, the first range larger than the second range, a size of the first range corresponding to a distance between possible initial scores that indicate different probabilities that a data value is in error based on the accuracy indication.

3. The method of claim 1, further comprising selecting a precision for the scores based on the estimated number of errors for the received code word.

4. The method of claim 1, wherein updating a score for a data value comprises one or more of adding a scaled count of unsatisfied check nodes associated with the data value to a previous score below a score threshold and subtracting the scaled count from a previous score above the score threshold, the scaled count comprising a first scale factor in response to the previous score failing to satisfy the score threshold and a second scale factor in response to the previous score satisfying the score threshold, the first scale factor greater than the second scale factor.

5. The method of claim 1, further comprising iteratively updating the scores for the data values until an iteration termination condition is satisfied, wherein the iteration termination condition is satisfied in response to one or more of an iteration limit being reached and the relationships described by the parity check matrix being satisfied.

6. The method of claim 1, wherein the ECC decoder determines whether to obtain the accuracy indication, assigns the scores, and updates the scores, the ECC decoder comprising one or more of logic hardware and executable code, the executable code stored on a computer readable storage medium.

7. The method of claim 1, wherein the accuracy indication comprises information read from a cell of a non-volatile storage medium using a plurality of read thresholds.

8. The method of claim 1, wherein the estimated number of errors for the code word comprises an actual number of errors in the code word, the actual number of errors determined for the code word by the ECC decoder.

9. An apparatus comprising:
    a soft information module of a low density parity check (LDPC) code decoder, the soft information module configured to determine soft information for a plurality of variable nodes of the LDPC code decoder for a received code word;
    a score module of the LDPC code decoder, the score module configured to iteratively calculate scores for the variable nodes, wherein iteratively calculating the scores comprises determining initial scores for the variable nodes based on the soft information and updating the scores based on relationships between the variable nodes, the relationships described by a parity check matrix; and
    a check node update module of the LDPC code decoder, the check node update module configured to iteratively revise one or more check nodes based on the scores.

10. The apparatus of claim 9, further comprising a precision selection module configured to select a range of possible values for the scores based on one or more of an estimated number of errors for the received code word and a desired level of error-correction capability.

11. The apparatus of claim 10, wherein the estimated number of errors for the received code word is based on an initial count of unsatisfied check nodes.

12. The apparatus of claim 9, further comprising an asymmetric range module configured to position a score threshold within a range of possible values for the scores, the score threshold dividing the range of possible values into a first range and a second range, the first range larger than the second range, a size of the first range corresponding to a distance between possible initial scores that indicate different estimated probabilities that a bit is in error.

13. The apparatus of claim 9, wherein a score for a variable node is based on a scaled count of unsatisfied check nodes associated with the variable node.

14. The apparatus of claim 9, further comprising:
    a control loop module configured to stop the iterations of the score module and the check node update nodule in response to one or more of an iteration limit being reached and the plurality of check nodes being satisfied;
    a return module configured to decode a corrected code word in response to the plurality of check nodes being satisfied, wherein a bit of the corrected code word corresponding to a variable node is flipped relative to a corresponding bit of the received code word in response to the score for the variable node satisfying a score threshold; and an iteration limit module configured to make a random adjustment to one or more of the scores in response to reaching the iteration limit.

15. An apparatus comprising:

means for reading an indication of accuracy for a data value of a code word received by a low density parity check (LDPC) code decoder, the data value corresponding to a message node of the LDPC code decoder;

means for determining a precision for a score for the message node based on one or more of an estimated number of errors for the received code word and a desired level of error-correction capability, wherein a value for the score is based on the accuracy indication, the precision for the score comprising a number of bits allocated for the score; and means for updating check nodes associated with the message node based on the score.

16. The apparatus of claim 15, further comprising means for determining the estimated number of errors based on an initial count of unsatisfied check nodes for the received code word.

17. The apparatus of claim 15, further comprising means for determining an initial score for the message node based on the accuracy indication.

18. The apparatus of claim 15, further comprising means for positioning a score threshold within the range of possible values for the score, the score threshold dividing the range of possible values into a first range and a second range, the first range larger than the second range, a size of the first range corresponding to a distance between possible initial scores that indicate different estimated probabilities that a bit is in error.

19. The apparatus of claim 15, wherein the desired level of error-correction capability is determined based on one or more of a program/erase count, an error rate, a failure of a storage element, a retirement of a storage element, and a re-use of a retired storage element.

* * * * *